United States Patent
Venkatasubramanian et al.

(10) Patent No.: US 7,342,169 B2
(45) Date of Patent: Mar. 11, 2008

(54) PHONON-BLOCKING, ELECTRON-TRANSMITTING LOW-DIMENSIONAL STRUCTURES

(75) Inventors: Rama Venkatasubramanian, Cary, NC (US); Edward Siivola, Raleigh, NC (US); Thomas Colpitts, Durham, NC (US); Brooks O'Quinn, Lillington, NC (US)

(73) Assignee: Nextreme Thermal Solutions, Research Triangle Park, NC (US)

( * ) Notice: Subject to any disclaimer, the term of this patent is extended or adjusted under 35 U.S.C. 154(b) by 633 days.

(21) Appl. No.: 10/265,409

(22) Filed: Oct. 7, 2002

(65) Prior Publication Data

US 2003/0099279 A1 May 29, 2003

Related U.S. Application Data

(60) Provisional application No. 60/327,030, filed on Oct. 5, 2001.

(51) Int. Cl.
  *H01L 35/16* (2006.01)
(52) U.S. Cl. .................. 136/236.1; 136/203; 136/205; 136/225; 136/227; 136/239; 257/183.1; 257/190; 257/470; 62/3.2; 62/3.7
(58) Field of Classification Search ............. 136/236.1, 136/225, 227, 239, 203, 205; 257/183.1, 257/190, 470; 62/3.2, 3.7
  See application file for complete search history.

(56) References Cited

U.S. PATENT DOCUMENTS

| | | | |
|---|---|---|---|
| 3,136,134 A | 6/1964 | Smith | |
| 3,296,034 A | 1/1967 | Reich | |
| 3,607,444 A | 9/1971 | Debucs | |
| 3,663,307 A | 5/1972 | Mole | |
| 4,443,650 A | 4/1984 | Takagi et al. | |
| 5,006,178 A | 4/1991 | Bijvoets | |
| 5,254,178 A | 10/1993 | Yamada et al. | |
| 5,430,322 A | 7/1995 | Koyanagi et al. | |
| 5,837,929 A | 11/1998 | Adelman | |
| 5,865,975 A | 2/1999 | Bishop | |

(Continued)

FOREIGN PATENT DOCUMENTS

| | | |
|---|---|---|
| EP | 0 687 020 | 12/1995 |
| EP | 0 805 501 | 11/1997 |
| JP | 6-97512 | 4/1994 |
| WO | WO98/43740 | 10/1998 |
| WO | WO98/44562 | 10/1998 |
| WO | WO 00/49664 | 8/2000 |
| WO | WO 01/08800 | 2/2001 |

OTHER PUBLICATIONS

Venkatasubramanian et al, "Phonon-Blocking Electron-Transmitting Structures," 18th International Conference on Thermoelectrics, IEEE (1999), pp. 100-103.*

(Continued)

*Primary Examiner*—Nam Nguyen
*Assistant Examiner*—Anthony Fick
(74) *Attorney, Agent, or Firm*—Myers, Bigel, Sibley & Sajovec, P.A.

(57) ABSTRACT

A thermoelectric structure and device including at least first and second material systems having different lattice constants and interposed in contact with each other, and a physical interface at which the at least first and second material systems are joined with a lattice mismatch and at which structural integrity of the first and second material systems is substantially maintained. The at least first and second material systems have a charge carrier transport direction normal to the physical interface and preferably periodically arranged in a superlattice structure.

45 Claims, 12 Drawing Sheets

U.S. PATENT DOCUMENTS

| | | | |
|---|---|---|---|
| 5,869,242 | A | 2/1999 | Kamb |
| 5,874,219 | A | 2/1999 | Rava et al. |
| 5,900,071 | A * | 5/1999 | Harman .................. 136/236.1 |
| 5,922,988 | A * | 7/1999 | Nishimoto .................. 136/225 |
| 6,060,331 | A * | 5/2000 | Shakouri et al. .............. 438/22 |
| 6,060,657 | A | 5/2000 | Harman |
| 6,062,681 | A | 5/2000 | Field et al. |
| 6,071,351 | A | 6/2000 | Venkatasubramanian |
| 6,072,925 | A | 6/2000 | Sakata |
| 6,084,050 | A | 7/2000 | Ooba et al. |
| 6,094,919 | A | 8/2000 | Bhatia |
| 6,154,266 | A | 11/2000 | Okamoto et al. |
| 6,154,479 | A | 11/2000 | Yoshikawa et al. |
| 6,180,351 | B1 | 1/2001 | Cattell |
| 6,271,459 | B1 | 8/2001 | Yoo |
| 6,282,907 | B1 | 9/2001 | Ghoshal |
| 6,300,150 | B1 | 10/2001 | Venkatasubramanian |
| 6,365,821 | B1 | 4/2002 | Prasher |
| 6,384,312 | B1 | 5/2002 | Ghoshal et al. |
| 6,403,876 | B1 | 6/2002 | Ghoshal et al. |
| 6,410,840 | B1 * | 6/2002 | Sudo et al. .................. 136/201 |
| 6,410,971 | B1 | 6/2002 | Otey |
| 6,412,286 | B1 | 7/2002 | Park et al. |
| 6,505,468 | B2 | 1/2003 | Venkatasubramanian |
| 6,605,772 | B2 | 8/2003 | Harman et al. |
| 6,696,635 | B2 | 2/2004 | Prasher |
| 2001/0052234 | A1 | 12/2001 | Venkatasubramanian |
| 2002/0053359 | A1* | 5/2002 | Harman et al. ............. 136/205 |
| 2002/0069906 | A1 | 6/2002 | Macris |
| 2002/0139123 | A1 | 10/2002 | Bell |

OTHER PUBLICATIONS

Oct. 9, 2001, RTI International,"New Thermoelectric Materials Can Keep Chips Cool Advances in Fiber Optics and in Biotechnology also are Likely".

RTI International Annual Report 2001, Turning Knowledge into Practice, pp. 4-37, 2001.

Thin-Film Thermoelectric Devices with High Room-Temperature Figures of Merit, Rama Venkatasubramanian et al., Research Triangle Institute, Research Triangle Park, North Carolina 27709, USA, 2001 Macmillan Magazines Ltd., Nature, vol. 413, Oct. 11, 2001, www.nature.com pp. 597-602.

In-situ Monitoring of the Growth $Bi_2Te_3$ and $Sb_2Te_3$ Films and $Bi_2Te_3$-$Sb_2Te_3$ Superlattice Using Spectroscopic Eillipsometry Hao Cui et al. Journal of Electronic Materials, vol. 30, No. 11, 2001, Special Issue Paper, pp. 1376-1381.

Thermal Characterization of $Bi_2Te_3$ /$Sb_2Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson [a], Electronic mail: goodson@vk.standord.edu, Journal of Applied Physics, vol. 90, No. 2, Jul. 15, 2001, pp. 763-767.

Smaller, Faster, Efficient Thermoelectric Cooling, Rama Venkatasubramanian, Technical Insights vol. 30, No. 41, Oct. 17, 2001 ISSN: 0300-757X, pp. 1-2.

CVD Diamond for Components and Emitters, J. Davidson et al., Diamond and Related Materials 10 (2001) pp. 1736-1742.

Sneak Preview, Optical Device Transfers Data Fast, Rama Venkatasubramanian, Design News Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolinia 27709, Physical Review B, vol. 61, No. 4, Jan. 15, 2000-II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103, IEEE.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-686.

RTI Research Yields Major Advance in Thermoelectrics, Rama Venkatasubramanian et al., pp. 8-9, date unknown.

Cooling Film Tempers Tiny Hot Spots, Rama Venkatasubramanian et al., Science News, No. 3,2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, N.C., Chapter 4, Semiconductors and Semimetals, vol., pp. 175-201, date unknown.

Improved Photoluminescence of GaAs in ZnSe/GaAs Heterojunctions grown by Organometallic Epitaxy, S.K. Ghandhi, et al., Electrical Computer, and Systems Engineering Department, Rensselaer Polytechnic Institute, Troy, New York 12180, Appl. Phys. Lett., vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, North Carolina 27709, J. Appl. Phys., vol. 66, No. 11, Dec. 1, 1989, pp. 5662-5664.

Incorporation Processes in MBE Growth of ZnSe, Rama Venkatasubramanian et al., Journal of Crystal Growth 95 (1989) pp. 533-537.

Radiative Recombination in Surface-free $n^+In^-In^+GaAs$ Homostructures, L.M. Smith and D.J. Wolford et al., Appl. Phys. Lett., vol. 57, No. 15, Oct. 8, 1990, pp. 1572-1574.

Measurement of AlGaAs/AlGaAs interface Recombination Velocities Using Time-Resolved Photoluminescence, M.L. Timmons, et al., Appl. Phys. Lett., vol. 56, No. 19, May 7, 1990, pp. 1850-1852.

Development of Low-Bandgap Ge and $Si_{0.07}Ge_{0.93}$ Solar Cells For Monolithic and Mechanically-Stacked Cascade Applications, Rama Venkatasubramanian et al. 1990 IEEE, pp. 73-78.

Graded-Band-GAP AlGaAs Solar Cells For AlGaAs/Ge Cascade Cells, M.L. Timmons, et al. 1990 IEEE, pp. 68-72.

Photoexcited Carrier Lifetimes and Spatial Transport in Surface-free GaAs Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 319-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1604-1605.

GaInAsP Lattice Matched to GaAs for Solar Cell Applications, P.R. Sharps, et al., Research Triangle Institute, P.O. Box 12194, RTP, NC 27709 1991 IEEE, pp. 315-317.

High-Temperature Performance and Radiation Resistance of High-Efficiency Ge and $Si_{0.07}Ge_{0.93}$ Solar Cells on Lightweight Ge Substrate, Rama Venkatasubramanian et al., pp. 85-98, date unknown.

An Inverted-Growth Approach To Development Of An IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

International Electron Devices Meeting, 1991, Physical Basis and Characteristics of Light Emission From Quantized Planar Ge Structures, Rama Venkatasubramanian, et al., 1991 IEEE pp. 15.4.1-15.4.4.

High Quality GaAs on Si Using $Si_{0.04}Ge_{0.96}$/Ge Buffer Layers, Rama Venkatasubramanian et al., Journal of Crystal Growth 107 (1991) pp. 489-493.

Optimization of the Heteroepitaxy of Ge on GaAs for Minority-Carrier Lifetime, Rama Venkatasubramanian, et al., Journal of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B, vol. 9, No. 4, Jul./Aug. 1991, pp. 2369-2376.
Advances in the Development of an AlGaAs/GaAs Cascade Solar Cell Using a Patterned Germanium Tunnel Interconnect, Rama Venkatasubramanian et al., Solar Cells, 30 (1991) pp. 345-354.
High-Quality Eutectic-Metal-Bonded AlGaAs-GaAs Thin Films on Si Substrates, Rama Venkatasubramanian et al., Appl. Phys. Lett., vol. 60, No. 7, Feb. 17, 1992, pp. 886-888.
Photoluminescence of Porous Silicon Buried Underneath Epitaxial GaP, J.C. Campbell, et al., Appl. Phys. Lett., vol. 60, No. 7, Feb. 17, 1992, pp. 889-891.
Interface-Free GaAs Structures—From Bulk to the Quantum Limit, D.J. Wolford, et al., Inst. Phys. Conf. Ser. No. 120: Chapter 9, pp. 401-406, date unknown.
Properties and Use of Cycled Grown OMVPE GaAs:Zn, GaAs:Se, and GaAs:Si Layers for High-Conductance GaAs Tunnel Junctions, Rama Venkatasubramanian et al., National Renewable Energy Laboratory, Golden, CO 80401, Journal of Electronic Materials, vol. 21, No. 9, 1992, pp. 893-899.
15.8%-Efficient (1-SUN, AM 1.5G) GaAs Solar Cell on Optical-Grade Polycrystalline Ge Substrate, Rama Venkatasubramanian et al., pp. 691-695, date unknown.
Development of 20% Efficient GaInAsP Solar Cells, P.R. Sharps, et al., 1993 IEEE pp. 633-638.
Development of High-Efficiency $Al_{0.2}Ga_{0.8}As$ Solar Cells and Interconnect Schemes For $Al_{0.2}Ga_{0.3}As/Si$ Mechanically-Stacked Cascade Cells, Rama Venkatasubramanian, et al., 1993 IEEE pp. 752-756.
Photoreflectance Characterization of InP and GaAs Solar Cells, R.G. Rodrigues et al., 1993 IEEE pp. 681-685.
Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.
GaAs and $Al_{0.2}Ga_{0.8}As$ Solar Cells With An Indirect-Bandgap $Al_{0.8}Ga_{0.2}As$ Emitter—Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC; Dec. 5-9, 1994; Hawaii, pp. 1839-1842.
The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.
Material and Device Characterization Toward High-Efficiency GaAs Solar Cells on Optical-Grade Polycrystalline Ge Substrates, Rama Venkatasubramanian, et al, R. Ahrenkiel, et al., First WCPEC; Dec. 5-9, 1994; Hawaii, 1994 IEEE pp. 1692-1696.
Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.
Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.
High-Efficiency Tandem Solar Cells on Single- and Poly-Crystalline Substrates, J.A. Hutchby et al., Center for Semiconductor Research, Research Triangle Institute, Research Triangle Park, NC 27709, USA, Solar Energy Materials and Solar Cells 35 (1994) pp. 9-24.
Optoelectronic Properties of Eutectic-Metal-Bonded (EMB) GaAs-AlGaAs Structures on Si Substrates, Rama Venkatasubramanian, et al.,Solid-State Electronics vol. 37, No. 11, pp. 1809-1815, 1994.
Heteroepitaxy and Characterization of Ge-rich SiGe Alloys on GaAs, Rama Venkatasubramanian et al., J. Appl. Phys., vol. 69, No. 12, Jun. 15, 1991, pp. 8164-8167.
18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.
Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, 15th International Conference on Thermoelectrics (1996), 1996 IEEE pp. 454-458.
Thermal Conductivity of Si-Ge Superlattices, S.-M. Lee and David G. Cahill[a)], Rama Venkatasubramanian, Appl. Phys. Lett. vol. 70, No. 22, Jun. 2, 1997 , pp. 2957-2959.
20% (AM1.5) Efficiency GaAs Solar Cells on Sub-mm Grain-Size Poly-Ge And Its Transition to Low-Cost Substrates, Rama Venkatasubramanian et al., 26th PVSC; Sep. 30-Oct. 3, 1997; Anaheim, CA, 1997 IEEE, pp. 811-814.
Electronic and Mechanical Properties of Ge Films Grown on Glass Substrates, R.K. Ahrenkiel et al., 26th PVSC; Sep. 30-Oct. 3, 1997; Anaheim, CA, pp. 527-529.
MOCVD of $Bi_2Te_3$ and Their Superlattice Structures for Thin-Film Thermoelectric Applications, Rama Venkatasubramanian et al., Journal of Crystal Growth 170 (1997), pp. 817-821.
A Silent Cool: Thermoelectrics May Offer New Ways to Refrigerate and Generate Power, Corinna Wu, Science News, Sep. 6, 1997 v152 n10 p152(2), pp. 1-3.
ONR Contributes to Thermoelectric Research (Office of Naval Research) (Brief Article), Ozone Depletion Network Online Today, Contact ONR, website http://www.onr.navy.mill., Nov. 2001.
In-Plane Thermoelectric Properties of Freestanding Si/Ge Superlattice Structures, Rama Venkatasubramanian et al., 17th International Conference on Thermoelectrics (1998), pp. 191-197.
Potential of Si-based Superlattice Thermoelectric Materials for Integration with Si Microelectronics, Rama Venkatasubramanian et al., 1998 IEEE, p. 869.
Low-temperature Organometallic Epitaxy and Its Application to Superlattice Structures in Thermoelectrics, Rama Venkatasubramanian, [a)], et al., Sandra Liu and Nadia El-Masry, Michael Lamvik, Applied Physics Letters, vol. 75, No. 8, Aug. 23, 1999, pp. 1104-1106.
Optical Constants of $Bi_2Te_3$ and $Sb_2Te_3$ Measured Using Spectroscopic Ellipsometry, Hao Cui, [1] I.B. Bhat, [1,3] and Rama Venkatasubramanian[2], 1.-Electrical, Computer and Systems Engineering Department, Rensselaer Polytechnic Institute, Troy, NY 12180-3590, USA. 2.-Research Triangle Institute, Research Triangle Park NC 27709, USA, 3.-e-mail:bhati@.rpi.edu., Journal of Electronics Materials, vol. 28, No. 10, 1999, pp. 1111-1114.
Thin-Film Technology, Research Triangle Institute, Investment Opportunities, in Thermoelectronics, Apr. 6, 2001, website http://www.rti.org/units/es.cfm, pp. 1-2, date unknown.
Nature Publishing Group, Materials Update, Cool Future for Semiconductors, Oct. 11, 2001, pp. 1-3.
Cool New Film, Science Update, Oct. 11, 2001, http://www.nature.com/nsu/011011/011011-12.html, pp. 1-2.
Semiconductors are Cool, News and Views, Cronin B. Vining, 2001 Macmillan Magazines Ltd., Nature, vol. 413, Oct. 11, 2001, www.nature.com, pp. 577-578.
Thermoelectric Boost, Richard Babyak, Appliance Manufacturer, Design and Engineering Solutions for the Global Appliance Industry, http://www.ammagazine.com/CDA/ArticleInformation/features/BNP_Features_ Item/0.260... Jul. 18, 2002, pp. 1-2.
Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea..., Jun. 20, 2002, pp. 1-3.
US 6,381,965, May 7, 2002 (withdrawn).
Development of Low-Bandgap Ge and $Sl_{0.07}Ge_{0.03}$ Solar Cells for Monolithic and Mechanically-Stacked Cascade Applications, Rama Venkatasubramanian et al., pp. 73-78, 1990.
Fields, S., Proteomics In Genomeland, Science vol. 291 No. 5507 pp. 1221-1224, pp. 1-7, 2001.
Graded-Band-GAP AlGaAs Solar Cells For AlGaAs/Ge Cascade Cells, M.L. Timmons, et al., pp. 68-72, 1990.
Fitch, J. Patrick, Bahrand Sokhansan, IEEE, Genomic Engineering: Moving Beyond DNA Sequence to Function, Proceedings of the IEEE, vol. 88, No. 12, Dec. 2000, pp. 1949-1971.
Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}As$ Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., Research Triangle Institute, P.O. Box. 12194, RTP, NC 27709. pp. 315-317, 1991.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-98, year not available.

Physical Basis and Characteristics of Light Emission From Quantized Planar Ge Structures, Rama Venkatasubramanian, et al., pp. 15.4.1-15.4.4, 1991.

High Quality GaAs on Si Using $Si_{0.04}Ge_{0.96}$/Ge Buffer Layers, Rama Venkatasbramanian, et al., Journal of Crystal Growth 107 (1991) pp. 489-493.

Optimization of the Heteroepitaxy of Ge on GaAs for Minority-Carrier Lifetime, Rama Venkatasubramanian, et al., Jouranl of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354, 1990.

High-Quality Eutectic-Metal-Bonded AlGaAs-GaAs Thin Films on Sl Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C., Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al, Inst. Phys. Conf. Ser. No. 120: Chapter 9, pp. 401-406, 1992.

Properties and Use of Cycled Grown OMVPE GaAs: Zn, GaAS:Se, and GaAS:Si Layers for High-Conductance GaAS Tunnel Junctions, Rama Venkatasubramanian et al., National Renewable Energy Laboratory, Golden, CO 80401, pp. 893-899, 1992.

Thermal Characterization of $Bi_2$, $Te_3$/$Sb_2$ $Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford. edu, Journal of Applied Physics, vol. 90, No. 2, Jul. 15, 2001, pp. 763-767.

Smaller, Faster, Efficient Thermoelectric Cooling, Rama Venkatasubramanian, vol. 30, No. 41, Oct. 17, 2001 ISSN: 0300-757X, pp. 1-2.

CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.

Sneak Preview, Optical Device Transfers Data Fast, Rama Venkatasubramanian, design news Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000-II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-686.

RTI Research Yields Major Advance in Thermoelectrics, Rama Venkatasubramanian et al., pp. 8-9, 2001.

Cooling Film Tempers Tiny Hot Spots, Rama Venkatasubramanian et al, Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, NC, Chapter 4, Semiconductors and Semimetals, vol. pp. 175-201, 2001.

The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian, 2002.

Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol. 66, No. 11, Dec. 1, 1989, pp. 5662-5664.

Radiative Recombination in Surface free $n^+In^-In^+$ GaAs Homostructures, L.M. Smith and D.J. Wolford et al., Appl. Phys. Lett., vol. 57, No. 15, Oct. 8, 1990, pp. 1572-1574.

Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.

Supplementary Partial European Search Report, Application No. EP 02 72 5575 Apr. 4, 2006.

* cited by examiner

PHONON-BLOCKING, ELECTRON-TRANSMITTING LOW-DIMENSIONAL STRUCTURES

CROSS REFERENCE TO RELATED DOCUMENTS

This application claims priority to U.S. Provisional Application No. 60/327,030 filed in the United States Patent and Trademark Office on Oct. 5, 2001, the entire disclosure of which is incorporated herein by reference. This application is related to U.S. Provisional Application No. 60/190,924 filed in the United States Patent and Trademark Office on Mar. 21, 2000, the entire disclosure of which is incorporated herein by reference. This application is related to U.S. Pat. No. 6,300,150 B1, the entire disclosure of which is incorporated herein by reference. This application is also related to U.S. Provisional Application No. 60/253,743, "Spontaneous Emission Enhanced Heat Transport Method and Structures for Cooling, Sensing, and Power Generation", filed Nov. 29, 2000, the entire disclosure of which is incorporated herein by reference.

BACKGROUND OF THE INVENTION

1. Field of the Invention

This invention relates to thermoelectric devices and applications of the same as coolers/heaters or power converters. The thermoelectric devices utilize thin film and/or superlattice technologies to improve the materials properties and improve device performance.

2. Discussion of the Background

Application of solid state thermoelectric cooling is expected to improve the performance of electronics and sensors such as for example RF receiver front-ends, infrared (IR) imagers, ultra-sensitive magnetic signature sensors, and superconducting electronics. Bulk thermoelectric materials typically based on p-$Bi_xSb_{2-x}Te_3$ and n-$Bi_2Te_{3-x}Se_x$ alloys have figures-of-merit (ZT) or coefficients of performance (COP) which result in poor thermoelectric device performance.

The performance of thermoelectric devices depends on the figure-of-merit (ZT) of the material given by $$ZT = (\alpha^2 T / \sigma K_T) \quad (1)$$

where $\alpha$, T, $\sigma$, $K_T$ are the Seebeck coefficient, absolute temperature, electrical condcutivity, and total thermal conductivity, respectively. Z, the material-coefficient, can be expressed in terms of lattice thermal conductivity ($K_L$), electronic thermal conductivity ($K_e$) and carrier mobility ($\mu$), for a given carrier density ($\rho$) and the corresponding $\alpha$, yielding eqn. (2).

$$Z = \frac{\alpha^2 \sigma}{K_L + K_e} \simeq \frac{\alpha^2}{\left(\frac{K_L}{\mu \rho q}\right) + L_o T} \quad (2)$$

Here, $L_O$ is the Lorenz number, approximately $1.5 \times 10^{-8} V^2/K^2$ in non-degenerate semiconductors. State-of-the-art thermoelectric devices utilize alloys, typically p-$Bi_xSb_{2-x}Te_{3-y}Se_y$ (x~0.5, y~0.12) and n-$Bi_2(Se_yTe_{1-y})_3$ (y~0.05) for the 200K-400K temperature range. For certain alloys, $K_L$ can be reduced more strongly than $\mu$ leading to enhanced ZT.

A ZT of 0.75 at 300K in p-type $Bi_xSb_{2-x}Te_3$ (x~1) was reported forty years ago. See for example Wright, D. A., Nature vol. 181, pp. 834 (1958). Since then, there has been modest progress in the ZT of thermoelectric materials near 300K. The highest ZT in any bulk thermoelectric material at 300K appears to be ~1.14 for p-type $(Bi_2Te_3)_{0.25}$ $(Sb_2Te_3)_{0.72}$ $(Sb_2Se_3)_{0.03}$ alloy. See for example Ettenberg, M. H., Jesser, W. A., & Rosi, F. D., "A new n-type and improved p-type pseudo-ternary $(Bi_2Te_3)(Sb_2Te_3)(Sb_2Se_3)$ alloy for Peltier cooling," Proc. of $15^{th}$ Inter. Conf. on Thermoelectrics, IEEE Catalog. No. 96TH8169, pp. 52-56 (1996).

Several approaches have been investigated to enhance ZT.

In bulk materials, cage-like structures simulating a phonon glass/electron crystal have been examined for reducing $K_L$ without deteriorating the electronic mobilities. See for example Slack, G. A. & Tsoukala, V. G., "Some properties of semiconducting $IrSb_3$," J. Appl. Phys. vol. 76, pp. 1665-1671 (1994).

A ZT greater than 1 has been reported in $LaFe_3CoSb_{12}$ at T>700K, attributed primarily to reduction of $K_L$ from La-filling. See for example Sales, B. C., Mandrus, D. & Williams, R. K., "Filled sketturudite antimonides: a new class of thermoelectric materials," Science vol. 272, pp. 1325-1328 (1996). A ZT of approximately 1.35 was reported in $CeFe_{35}Co_{0.5}Sb_{12}$ where, although a dramatic reduction in $K_L$ of the filled skuterrudite was observed near 300K, there was apparently less role of La-filling at higher temperatures where the enhanced ZT was observed. 900K. See for example Venkatasubramanian, R., "Cascade Cryogenic Thermoelectric Cooler," U.S. Patent Application No. 60/190,924; the entire contents of which are incorporated herein by reference. A ZT significantly greater than 1 has not been demonstrated at ordinary temperatures (300K).

A one-to-one correlation between lower $K_L$ and enhanced ZT has not been established. More importantly, the concept of individually tailoring the phonon properties for thermal conductivity reduction without deteriorating electronic transport, thereby enhancing ZT, has not been established, prior to the present invention. Thin-film thermoelectric materials offer a tremendous scope for ZT enhancement, and three generic approaches have been disclosed.

One approach involves the use of quantum-confinement effects to obtain an enhanced density-of-states near Fermi-energy. See for example Hicks, L. D. & Dresselhaus, M. D. Effect of quantum-well structures on the thermoelectric figure of merit. Phys. Rev. B 47, pp. 12727-12731 (1993).

A second approach involves phonon-blocking/electron transmitting superlattices. See for example Venkatasubramanian, R., "Thin-film superlattice and quantum-well structures—a new approach to high-performance thermoelectric materials," Naval Res. Rev. vol. 58, pp. 31-40 (1996). See also Venkatasubramanian, R. et. al, "Organometallic Epitaxy of Bi2Te3 and Related Materials and the Development of Planar, Monolithically-Interconnected, Superlattice-Structured, High-Efficiency Thermoelectric Elements", Proc. Of 1st National Thermogenic Cooler Workshop (ed. Horn, S. B.) 196-231 (Center for Night Vision and Electro-Optics, Fort Belvoir, Va., 1992). See also Venkatasubramanian R. and Colpitts. T., Material Research Society Symposium Proceedings, Vol. 478, p.73, (1997). See also Venkatasubramanian R., Timmons, M. L., and Hutchby. J. A., Proc. Of 12th International Conf. On Thermoelectrics, Yokohama, ed. by K. Matsuura, 322, 1 (1993). These structures utilize acoustic-mismatch between the superlattice components to reduce KL while avoiding the conventional alloying for reducing KL, thus potentially eliminating alloy scattering of carriers. See for example Venkatasubramanian, R., Naval Res. Rev. Vol. 58, pp. 31-40 (1996), R. Venkatasubramanian, E. Siivola, T. Colpitts, and B. O'Quinn, $18^{th}$ International Conference on Thermoelectrics, IEEE (1999) p. 100-103, and Venkatasubramanian, R. et al., "Low-temperature organometallic epitaxy and its application to superlattice structures in thermoelectrics," Appl. Phys. Lett. vol. 75, pp. 1104-1106, (1999).

A third approach is based on thermionic effects in heterostructures. See for example Mahan, G. D. & Woods, L. M., "Multilayer thermionic refrigeration," Phys. Rev. Lett. Vol. 80, pp. 4016-4019 (1998), and Shakouri, A. & Bowers, J. E., "Heterostructure integrated thermionic coolers," Appl. Phys. Lett. vol. 71, pp. 1234-1236 (1997).

However, in all these approaches the degree of acoustic mismatch between the thermoelectric heterostructures has not been applied to thermally conducting structures without simultaneously deteriorating the electronic transport or with simultaneously enhancing the electronic transport or with simultaneously removing the electrical anisotropy and therefore significantly limiting the enhanced thermoelectric performance of the ensuing materials and devices disclosed therein.

SUMMARY OF THE INVENTION

Accordingly, one object of the present invention is to provide an improved thermoelectric material and novel thermoelectric devices incorporating the improved material.

Another object of the present invention is to produce a phonon-blocking electron transmitting structure.

Still a further object of the present invention is to realize, using the above-noted phonon-blocking electron transmitting structure, improved thermoelectric coolers and improved heaters and thermoelectric power converters.

Still a further object of this invention is to realize periodic nanostructures, with dimensions of the periodicity in the range of 10 to 100 Angstroms at least along one of the coordinate axes, such that phonon propagation along at least one of the coordinate axes is impeded, thereby reducing the lattice thermal conductivity in that direction, without deteriorating electronic transport along the same direction, thereby enhancing the ZT.

These and other objects are achieved according to the present invention by providing a novel thermoelectric structures which include at least first and second material systems having different lattice constants and interposed in contact with each other, and a physical interface at which the at least first and second material systems are joined with a lattice mismatch and at which structural integrity of the first and second material systems is substantially maintained. The at least first and second material systems have a charge carrier transport direction normal to the physical interface and preferably periodically arranged in a superlattice structure. The at least first and second material systems in contact with each other have a lattice mismatch in a plane perpendicular and/or in a plane parallel to a central axis common to both materials systems. A periodicity of the at least first and second material systems is configured to reduce thermal conduction in a direction along the periodicity. The perpendicular plane is substantially normal to an electrical carrier transport direction in the device, and the lattice mismatch provides an acoustic mismatch to reduce the thermal conduction along the electrical carrier transport direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
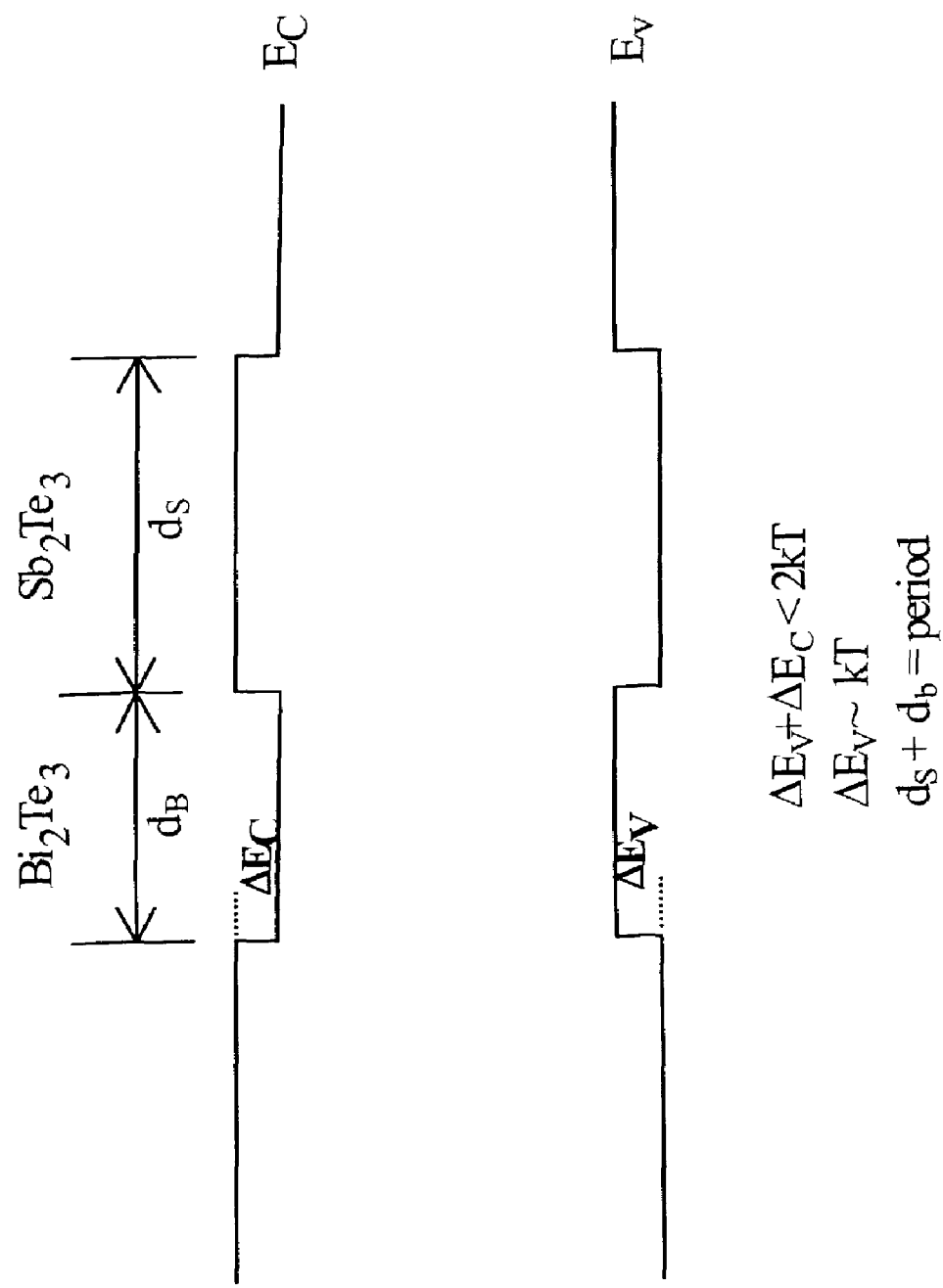
FIG. 1 is a graph depicting hole transport across a $Bi_2Te_3/Sb_2Te_3$ superlattice interface can be understood from A) the anticipated heterojunction band-diagram; B) the observed hole mobility anisotropy versus superlattice period for the case of $d_{Bi2Te3}=d_{Sb2Te3}=(\frac{1}{2})$ period; C) the hole mobility anisotropy in other $Bi_2Te_3/Sb_2Te_3$ superlattices.

The present invention utilizes phonon-blocking to enhance ZT via a thermal conductivity reduction in for example superlattice structures, thus avoiding a recourse to solid solution alloying and thereby eliminating alloy scattering of carriers that reduce the electrical conductivity. The "ideal" superlattice structures of the present invention block, reduce, or impede the propagation of lattice phonons, but not the charge (i.e. electrical) carriers.

In the structures of the present invention, a phonon transport barrier exists along a principal heat-conducting axis of these structures, no electrical barrier exists for carrier transport along this axis, and quantum confinement of charge carriers in directions normal to the heat-conducting axis increases the electronic density of states and thereby improves the Seebeck coefficient and thus the figure of merit ZT for these structures. The phonon transport barriers minimize thermal transport along the heat-conducting axis of the thermoelectric material during the device operation. Further, a physical interface between the two material systems forming the superlattice accommodates across the interface lattice mismatch between the two material systems. By accommodating the lattice mismatch across the interface, the subsequent growth of either of the materials in the superlattice system occurs without substantial disruption to the intervening physical interface as would occur for example in strongly covalently bonded systems such as for example $Si_xGe_{1-x}$ and $Si_yGe_{1-y}$ superlattices. Accordingly, in the present invention, abrupt interfaces between lattice mismatched superlattice materials form the aforementioned phonon transport barriers.

In this disclosure, a major enhancement in thermoelectric figure-of-merit (ZT) at 300K of ~2.4 in p-type $Bi_2Te_3/Sb_2Te_3$ superlattices is disclosed as well as a similar, although less dramatic, ZT~1.4 in n-type $Bi_2Te_3/Bi_2Te_{2.83}Se_{0.17}$ superlattices. Further, alternative superlattice and other heterogeneous thermoelectric material structures are disclosed herein. The use of superlattices, as for example the superlattices described herein, can substantially enhance electrical conduction along the direction normal to the superlattice interface, over what would be realized in comparable alloys. This enhancement occurs by the formation of conduction minibands and/or the removal of band offsets in certain superlattice structures (such as for example a 10 Å/50 Å $Bi_2Te_3/Sb_2Te_3$ structure) that typically occur at the hetero-interfaces. Such effects are also likely in other superlattice material systems such as PbTe/PbTeSe, ZnSb/CdSb, PbTe/SnTe, InAs/GaAs, Si/Ge, HgTe/CdTe, $Bi_2Te_3/As_2Te_3$, $Bi_2S_3/As_2S_3$, etc., whereby the use of superlattices can greatly improve the electrical transport perpendicular to the periodic superlattice interfaces, in addition to reducing the lattice thermal conductivity perpendicular to the superlattice interfaces. Especially of interest in these material systems, for removing the electrical barriers associated with band offsets, are superlattices where one of the material component is a sub-unit cell thick. One such example is the aforementioned 10 Å/50 Å $Bi_2Te_3/Sb_2Te_3$ structure. The 10 Angstrom thick $Bi_2Te_3$ layer thickness is smaller than the unit cell of $Bi_2Te_3$ along c-axis, which is 30 Angstroms.

ZT values disclosed herein were measured in devices using the Harman technique, where parameters related to $\sigma$, $K_T$, $\alpha$ that make up ZT are measured at the same place, same time, with current flowing. See for example Harman, T. C., Cahn, J. H. & Logan, M. J., "Measurement of thermal conductivity by utilization of the Peltier effect,". J. Appl. Phys. 30, pp. 1351-1359 (1959). This method has been extended with a variable-thickness approach to obtain intrinsic ZT and other thermoelectric parameters. See for example Venkatasubramanian, R., Siivola, E., Colpitts, T., and O'Quinn, B., "Thin-film thermoelectric devices with high room-temperature figures of merit," Nature, Oct. 11, 2001. P-type phonon-blocking superlattice devices show significant sub-ambient cooling of as much as 40K and 32K for $T_{hot}$ of 353K and 298K, respectively, and the ability to remove heat-flux of 700 Watts/cm². Photolithographically processed devices and the short thermal response times associated with heat transport in thin-films can enable a concept of "anywhere, any time" cooling/heating. See for example U.S. Pat. No. 6,300,150 and for example Venkatasubramanian, R., "Thin-film Thermoelectric Cooling and Heating Devices for DNA Genomics/Proteomics, Thermo-Optical Switching-Circuits, and IR Tags," U.S. Pat. Application No. 60/282,185; the entire contents of which are incorporated herein by reference.

Potential Ideality of Superlattices in $Bi_2Te_3$ Material System

High-quality superlattices have been demonstrated in the $Bi_2Te_3$ system, with one of the individual layers as small as 10 Å, using a low-temperature growth process. See for example Appl. Phys. Lett. vol. 75, pp. 1104-1106, (1999) and U.S. Pat. No. 6,071,351. Ultra-short-period superlattices offer significantly higher in-plane carrier mobilities (parallel to the superlattice interfaces) than the alloys of similar composition due to the near-absence of alloy scattering and random interface carrier scattering.

According to the present invention, the enhanced carrier mobilities in monolayer-range superlattices are effective in the cross-plane direction for certain superlattices where a reduced $K_L$ and so an enhanced ZT (eqn. (2)) is obtained. Full details of the determination of cross-plane electrical transport in superlattices are discussed in Venkatasubramanian, R., Siivola, E., Colpitts, T., and O'Quinn, B., "Thin-film thermoelectric devices with high room-temperature figures of merit," Nature, Oct. 11, 2001.

Figure 1B:
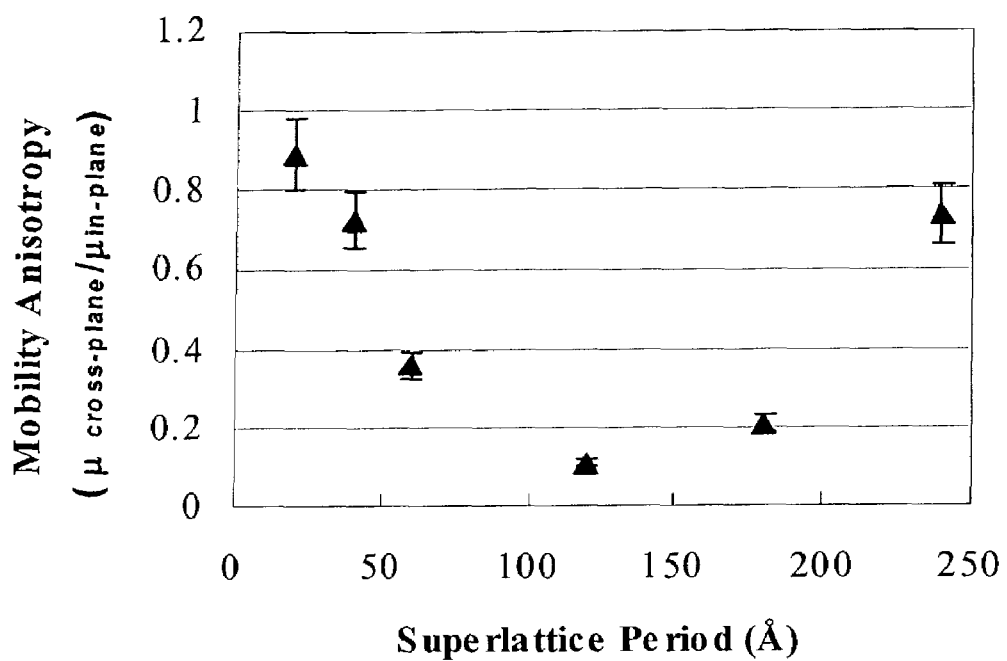
Figure 1C:
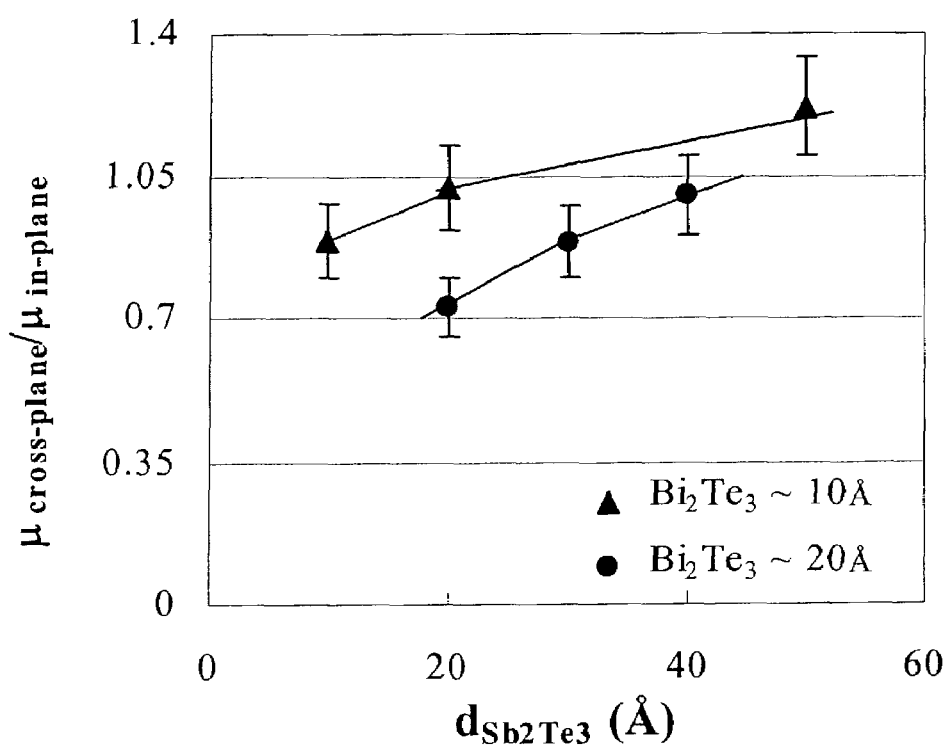

Referring now to the drawings, wherein like reference numerals designate identical or corresponding parts throughout the several views, and more particularly to FIGS. 1A-C. The anticipated heterostructure band diagram in short-period/shallow potential superlattices is shown in FIG. 1A, where the valence-band offset is expected to be less than the average thermal energy of carriers. Thus, for 300K, with a kT of ~0.026 eV, the desired valence band offset would be much less than 0.026 eV. The variation of the mobility anisotropy as a function of superlattice period, for $d_{Bi2Te3}=d_{Sb2Te3}$, is shown in FIG. 1B. Note the free-carrier concentration is isotropic, so the ratio of electrical resistivity anisotropy is inversely related to the mobility anisotropy, i.e., ($\mu_{cross-plane}/\mu_{in-plane}$). The mobility anisotropies of the 10 Å/10 Å, 10 Å/20 Å, 10 Å/50 Å, 20 Å/20 Å, 20 Å/30 Å, and 20 Å/40 Å are shown in FIG. 1C. The measured cross-plane mobilities in the $Bi_2Te_3/Sb_2Te_3$ superlattices appear to be consistent with a miniband conduction across the superlattice interfaces, with fully-developed or larger valence band-offsets in structures for $Bi_2Te_3$ thickness $\geq$30 Å. The data is qualitatively similar to the transport models developed for AlGaAs/GaAs superlattices, but never reported in the $Bi_2Te_3/Sb_2Te_3$ systems with sub unit cell layers in superlattices. See for example Palmier, J. F. in "Heterojunctions and Semiconductor Superlattices," Eds. Allan, G., Bastard, G., Boccara, N., Launoo, N. & Voos, M. (Springer-Verlag, Berlin, 1986).

From FIG. 1C, the 10 Å/50 Å, 20 Å/40 Å and 10 Å/20 Å Bi$_2$Te$_3$/Sb$_2$Te$_3$ superlattices of the present invention show cross-plane electrical conductivities comparable to in-plane values. Of these, the 10 Å/50 Å superlattice appears to offer higher cross-plane electrical conductivity in the in-plane direction. This is extremely desirable for thermoelectric devices disclosed in U.S. Pat. No. 6,300,150; the entire contents of which are incorporated herein by reference. Thus, in a preferred embodiment of the present invention, the periods of 50 to 60 Å are desirable for minimizing $K_L$; thus the 10 Å/50 Å and 20 Å/40 Å superlattices are useful for enhanced ZT.

Figure 2:
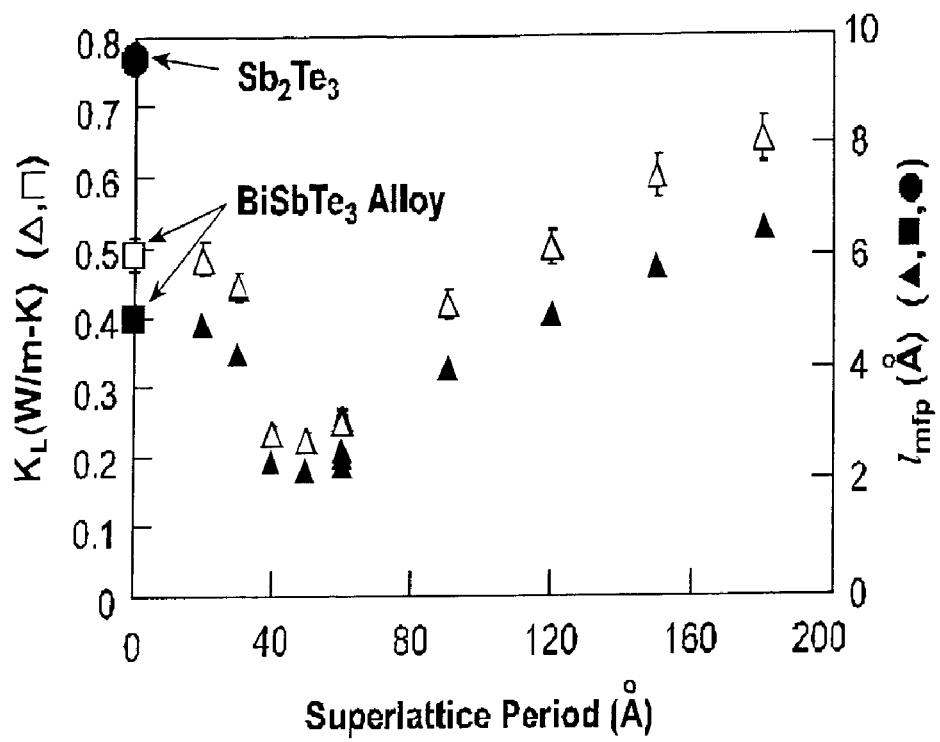
FIG. 2 is a graph depicting the thermal conductivity as a function of a superlattice period.

FIG. 2 is a graph depicting the thermal conductivity as a function of a superlattice period. The Bi$_2$Te$_3$/Sb$_2$Te$_3$ superlattices of the present invention show a significantly reduced $K_L$ as compared to bulk alloys, depicted by the values for a superlattice period of zero.

A full description of the measurement procedure, the data, and the mechanisms are disclosed in Venkatasubramanian, R., "Lattice thermal conductivity reduction and phonon localization like behavior in superlattice structures," Phys. Rev. B vol. 61, pp. 3091-3097 (2000). The thermal behavior of the superlattices of the present invention is consistent with phonon-transmission experiments in GaAs/AlGaAs superlattices in which coherent backscattering of phonons at superlattice interfaces is invoked but the details of which re more complex and subtle.

The reduction to practice shown in the present invention of enhanced ZT suggests that coherent backscattering of phonons at superlattice interfaces can yield lower $K_L$ in the superlattice structures without a deterioration of electronic transport. The in-plane lattice mismatch at these superlattice interfaces is expected to be in the range of 3.6%. But lattice mismatches, in other material systems, in the range of 1 to 5% are expected to be useful. The cross-plane lattice mismatch is expected to be in the range of 4.5%. But lattice mismatches, in other material systems, in the range of 1 to 100% are expected to be useful. A lower in-plane lattice mismatch, thereby the less likely creation of defects that can cause carrier scattering, and a higher cross-plane lattice mismatch, thereby providing a maximum acoustic mismatch along the direction of heat flow, is preferred in the present invention.

In conventional thermoelectric superlattices, such as for example Si$_x$Ge$_{1-x}$/Si$_y$Ge$_{1-y}$ (x not equal to y) and PbTe/PbTe$_{1-x}$Se$_x$, there are covalent bonds in all directions, unlike the Van der Waals bonding between interfaces in the Bi$_2$Te$_3$/Sb$_2$Te$_3$ superlattices of the present invention. Accordingly, conventional thermoelectric superlattices are fabricated to minimize lattice mismatch in order to reduce defects in the superlattice materials.

For the Bi$_2$Te$_3$/Sb$_2$Te$_3$ superlattices, Venkatasubramanian, R. in Phys. Rev. B 61, 3091-3097 (2000) discloses a minimum of ~0.22 W/m-K at ~50 Å in Bi$_2$Te$_3$/Sb$_2$Te$_3$ superlattices. This value is nearly a factor of 2.2 smaller than the $K_L$ of alloy (~0.49 W/m-K) along the same c-axis. $K_L$ for all the 60 Å-period structures, whether it be 30 Å/30 Å or 10 Å/50 Å or 20 Å/40 Å. This value of about 0.25 W/m-K. $K_L$ appears to be more dependent on the superlattice period and relatively independent of the thickness of the constituents. The electronic transport depends on the period and the relative thickness of the constituents (FIG. 1B and 1C). These parameters are useful metrics in superlattice design for improved thermoelectric performance. $K_L$ of 0.22 W/m-K for the optimal superlattice compare favorably with the minimum thermal conductivities ($K_{min}$) predicted for Bi$_2$Te$_3$, using a full-wavelength or half-wavelength model of Slack for phonon mean-free-path. See for example Slack, G. Solid State Physics, Ed. By Ehrenreich, H., Seitz, F. & Turnbull, D. Ser. 34, (1979) and Scherrer, H. & Scherrer, S. in CRC Handbook of Thermoelectrics, Ed. by Rowe, D. M. (CRC Press, New York, 1995); the entire contents of both references are incorporated herein by reference.

Experimental measurements of $K_L$ of alloys (a-b and c-axes, the c-axis known as the trigonal axis with the a-b axis perpendicular to the c-axis) show that $K_L$ in the superlattices approach $K_{min}$ estimated from the models of Slack and Cahill. When all the phonons have a mean-free-path equal to the lattice spacing, $K_{min}$ is expected to be between the models of Slack and Cahill. The phonon mean-free-path from kinetic theory is in the range of 2.2 Å using $K_L$ of 0.22 W/m-K. This is close to the average inter-atomic spacing in Bi$_2$Te$_3$ and Sb$_2$Te$_3$ along c-axis. Thus, these are characteristics of ideal superlattices for minimizing thermal conductivity.

Variable-Thickness ZT Measurements

Figure 3A:
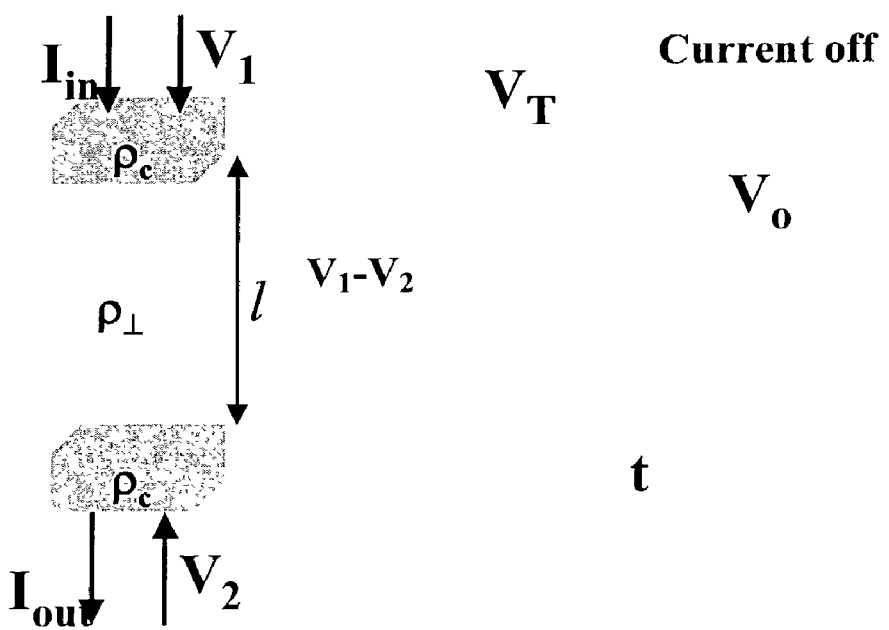
FIG. 3A depicts a schematic and a graph illustrating measurement of thermoelectric material properties by a 4-probe Harman method.

The ZT of a thermoelectric material can be obtained from a unipolar thermoelement across which a temperature difference is developed due to Peltier effect from a quasi-steady-state current as in FIG. 3A. During device operation, a current (I) leads to Ohmic ($V_R$) and Peltier ($V_O$) voltages across the thermoelement. $V_R$ includes that from the bulk-resistance of the mesa and that from the two contacts (eqn. (3)).

$$V_R = \rho_\perp (1/a) I + 2(\rho_c/a) I \tag{3}$$

Here, $\rho_\perp$, $\rho_c$ (in Ohm-cm$^2$), 1 and a are the cross-plane electrical resistivity of the superlattice, the average specific resistivity of the two contacts, the height and cross-sectional area of the mesa device, respectively. $V_O$, given eqn. (4), is related to the total thermal conductivity and Seebeck coefficient ($\sigma_\perp$) in the cross-plane direction. Ideal superlattices, with negligible offsets and a miniband conduction as discussed earlier, exhibit only small differences between in-plane Seebeck coefficient ($\alpha_=$), parallel to the interfaces of the superlattices, and the cross-plane Seebeck coefficients.

$$V_O = (\rho_\perp^2/K_T) T (1/a) I \tag{4}$$

From eqns. (3) and (4), extrinsic or device figure-of-merit ($ZT_e$) as ($V_O/V_R$) are derived from eqn. (5). In thick (i.e., large l) bulk elements, where $2(\rho_c/\rho_\perp l)$ is rather small, $ZT_e$ approaches the intrinsic or material figure-of-merit ($ZT_i$) given by eqn. (1).

$$ZT_e = V_O/V_R = \{\rho_{195}^2 T/K_{.T} \rho_\perp\}[1+2(\rho_c/\rho_\perp \cdot 1)]^{-1} \tag{5}$$

$P_\perp$ and $(\sigma_\perp^2/K_T)$ T are derivable, respectively, from the variation of $V_R$ and $V_O$ with 1 (or mathematically equivalent I·1/a). Thus, $ZT_i$ is $$ZT_i = [\partial V_O/\partial (I1/a)]/[\partial V_R/\partial (I \cdot 1/a)] \tag{6}$$

Figure 3B:
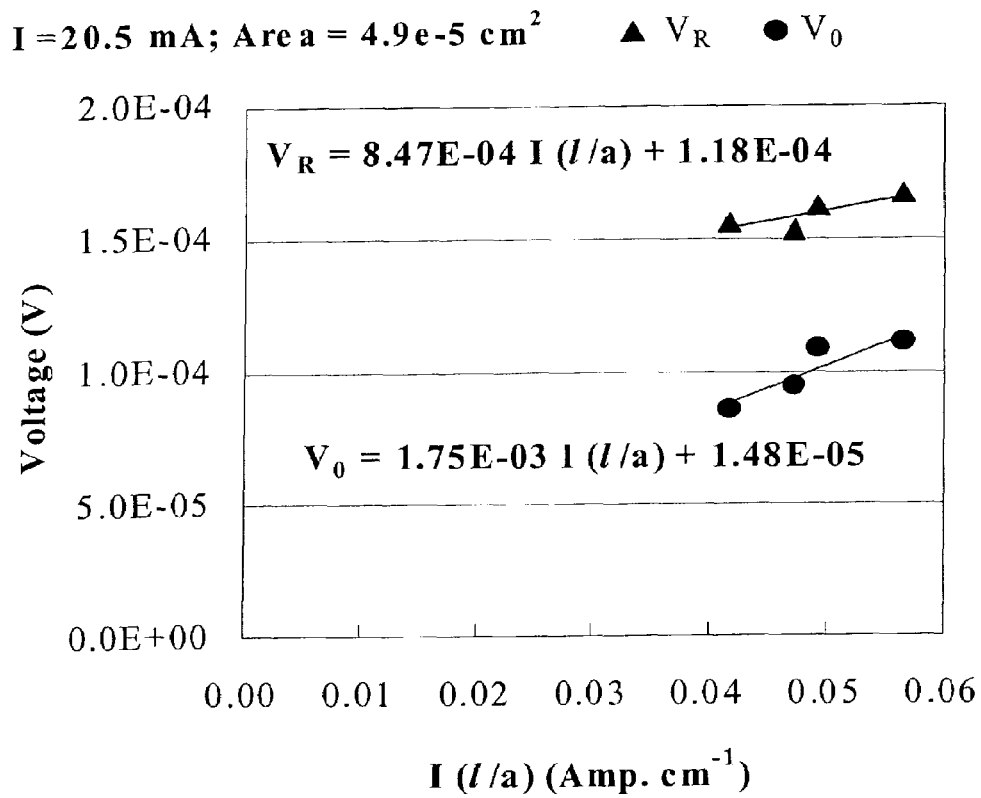
FIG. 3B depicts a graph showing Ohmic and Peltier voltages across a thermoelement derived from a variable-thickness ZT measurement.
Figure 3C:
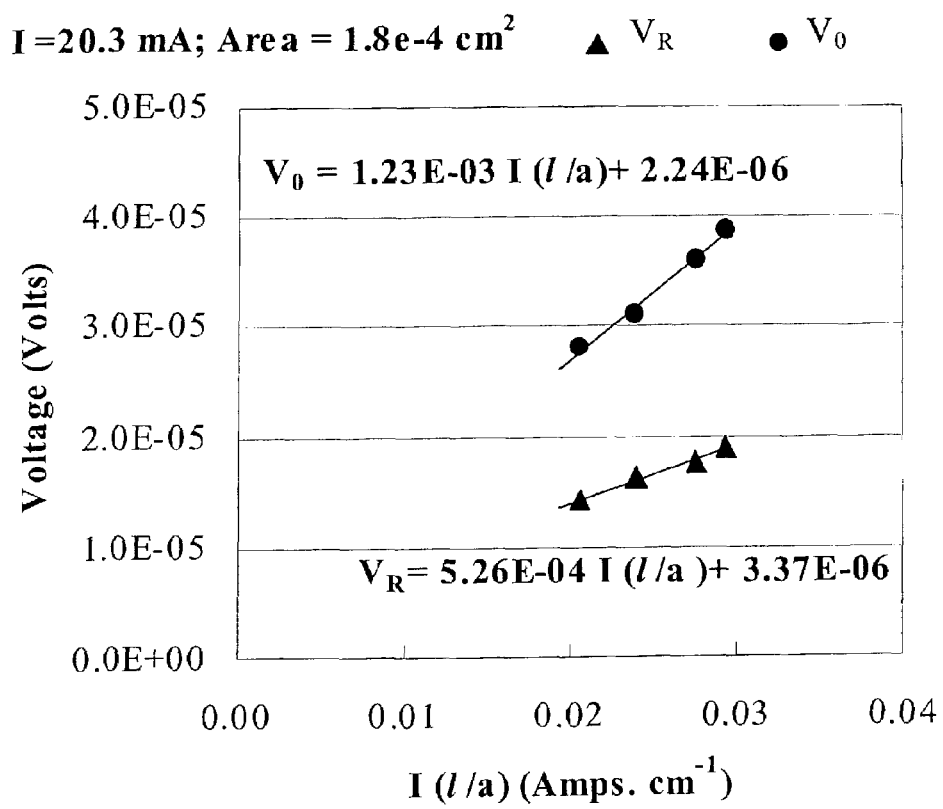
FIG. 3C depicts another graph showing Ohmic and Peltier voltages across a thermoelement derived from a variable-thickness ZT measurement.

The data from variable-mesa-thickness experiments are shown in FIG. 3B and FIG. 3C. The variable-thickness method for extracting $ZT_i$ works for both medium to good $\rho_c$, (i.e., the medium to good device $ZT_e$ shown in FIGS. 3B and 3C, respectively).

In FIG. 3B, a $ZT_e$ is obtained (given by $V_O/V_R$) for the largest mesa thickness of ~1.35 μm of ~0.66. Even so, the ratio of the two slopes, from eqn. (6) above, gives a $ZT_i$ of 2.07.

An intercept of $V_R$ versus I 1/a can be used to obtain the specific contact resistivities.

The average $\rho_c$ for the sample in FIG. 3b is ~1.45E-7 Ohm-cm$^2$.

Although more than a factor of ten smaller than in bulk technology, it is still high for thin-film devices, limiting the extrinsic ZT to ~0.66.

In FIG. 3C, however, a combination of thicker 10 Å/50 Å $Bi_2Te_3/Sb_2Te_3$ superlattice (thickest mesa ~2.67 μm) and an improved contact (average $\rho_c$~1.5E-8 Ohm-cm$^2$) lead to a $ZT_e$ of ~2.04 for the thickest mesa. The obtained low-resistivity Ohmic Contacts ($\leq$1E-7 Ohm-cm$^2$) facilitate transfer of the high intrinsic ZT materials property of the superlattice material to a high performance thin film (i.e., 1 to 100 micron) thermoelectric device.

The contacts of the present invention can include multi-layer metallizations of Cr/Au/Ni/Au and Ni/Au. Examples of other conductive metal layers suitable for use in the present invention include Au, Cu, Ni, Ag, Pd, Pt, Al, Ga, In, and alloys containing these metals. The use of Cr is desired for improving or obtaining better adhesion of the metal layer to the superlattice surface. Examples of other adhesion promoters suitable for use in the present invention besides Cr are NiCr, Ti, Mo, W, and alloys containing these metals. Ni is included to provide a diffusion barrier to bonding materials such as Pb—Sn, which are needed in bonding the thermoelectric devices to a heat-source or heat-sink header from diffusing into the superlattice. Examples of other diffusion barriers suitable for use in the present invention besides Ni include Cr, Pd, Fe, and other metals, thickness of a few thousand Angstroms to several microns, with a lattice structure different from the superlattice materials.

The thickness of various ohmic metallizations of the present invention can be Cr/Au/Ni/Au of 300 Å/3000 Å/300 Å/3000 Å and Ni/Au of 300 Å/3000 Å, upon which additional metals such as thick Au or Pb—Sn can be used to reduce spreading resistances.

For the 10 Å/50 Å $Bi_2Te_3/Sb_2Te_3$ superlattice shown in FIG. 3B, the measured cross-plane electrical resistivity ($\rho_\perp$) is 8.47E-4 Ohm-cm. With an in-plane electrical resistivity ($\rho_{in-plane}$) of 9.48E-4 Ohm-cm, $\rho_\perp/\rho_{in-plane}$ or $\mu_{195}/\mu_{in-plane}$ is ~1.12. For the sample in FIG. 3C, $\rho_\perp$ is 5.26e-4 Ohm-cm and the $\rho_{in-plane}$ is 5.5E-4 Ohm-cm, and the anisotropy is ~1.05. These are comparable to that indicated in FIG. 1C for the 10 Å/50 Å. $Bi_2Te_3/Sb_2Te_3$ superlattice structure, suggesting good agreement between the two independent TLM and the variable-mesa-thickness ZT methods.

Figure 3D:
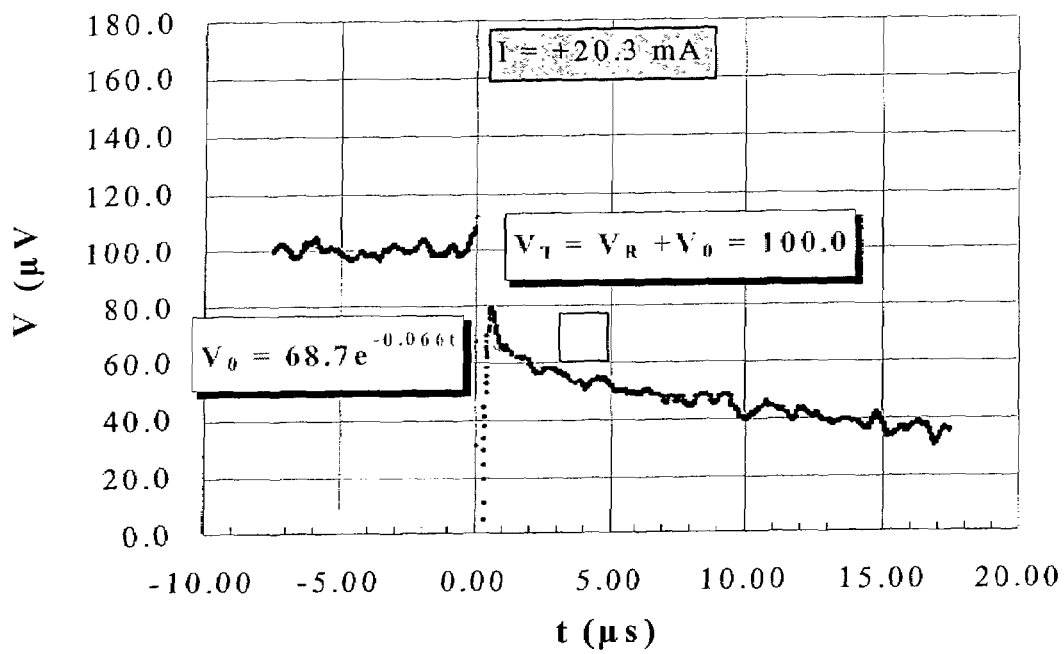
FIG. 3D depicts a graph showing Ohmic and Peltier voltage results of a Harman-method transient on a 5.4-micron-thick 10 Å/50 Å $Bi_2Te_3/Sb_2Te_3$ superlattice material of the present invention.

FIG. 3D shows the conventional Harman-method transient for a ~5.4-micron-thick 10 Å/50 Å $Bi_2Te_3/Sb_2Te_3$ superlattice device. The average $ZT_e$ for two current directions was 2.38+−0.19 at 300K. The material parameters for this 5.4-micron-thick superlattice film indicated a $ZT_i$ of 2.59 and the measured $ZT_e$ of 2.38 translates to a $\rho_c$ of ~1.3E-8 Ohm-cm$^2$, consistent with FIG. 3C. Thus, in going from a superlattice device of ~1.35 μm to ~2.67 μm to ~5.4 μm, no significant change in $ZT_i$ is observed, and $ZT_e$ approaches $ZT_i$ due to a decreasing role of contact resistances (eqn. 5).

As a check, ZT was measured on both ~1-mm-thick and thinned-down (5 to 20 microns) thermoelements made from bulk p-type $Bi_xSb_{1-x}Te_{3-y}Se_y$ (x~0.63±0.12; y~0.12) alloys, comparable to those alloys of Ettenberg et al. See for example Ettenberg, M. H., Jesser, W. A., & Rosi, F. D., "A new n-type and improved p-type pseudo-ternary ($Bi_2Te_3$) ($Sb_2Te_3$)($Sb_2Se_3$) alloy for Peltier cooling," Proc. of 15$^{th}$ Inter. Conf. on Thermoelectrics, IEEE Catalog. No. 96TH8169, 52-56 (1996). The variable-thickness method indicates a $ZT_i$ of ~1.09 at 300K along the a-b axis in agreement with Ettenberg et al.

Thus, no unexpected benefits are observed resulting from just utilizing a thin-film version of the standard commercial material. Also, the ZT values in alloy films (non-superlattice structures) along the c-axis are in the range of 0.4±0.13 for carrier levels of ~3E19 cm$^{-3}$, consistent with reported values for bulk materials.

From temperature-dependent measurements of ρ, α, and $K_T$ of the p-type superlattice and noting that there is little electrical anisotropy, the estimated $ZT_i$ vs. T of 10 Å/50 Å p-type $Bi_2Te_3/Sb_2Te_3$ superlattice is shown in FIG. 3 along with those of several materials.

It appears that the superlattices would offer enhanced performance over bulk p-type $Bi_{2-x}Sb_xTe_3$ alloys at lower temperatures. This is partly due to the fact that the efficacy of superlattices in reducing $K_L$ improves at lower temperatures similar to our preliminary results in Si/Ge superlattices. See for example Lee, S. M., Cahill, D. G., and Venkatsubramanian, R., Appl. Phys. Lett., vol. 70, pp. 2957-2959 (1997); the entire contents of which are incorporated by reference.

Figure 4:
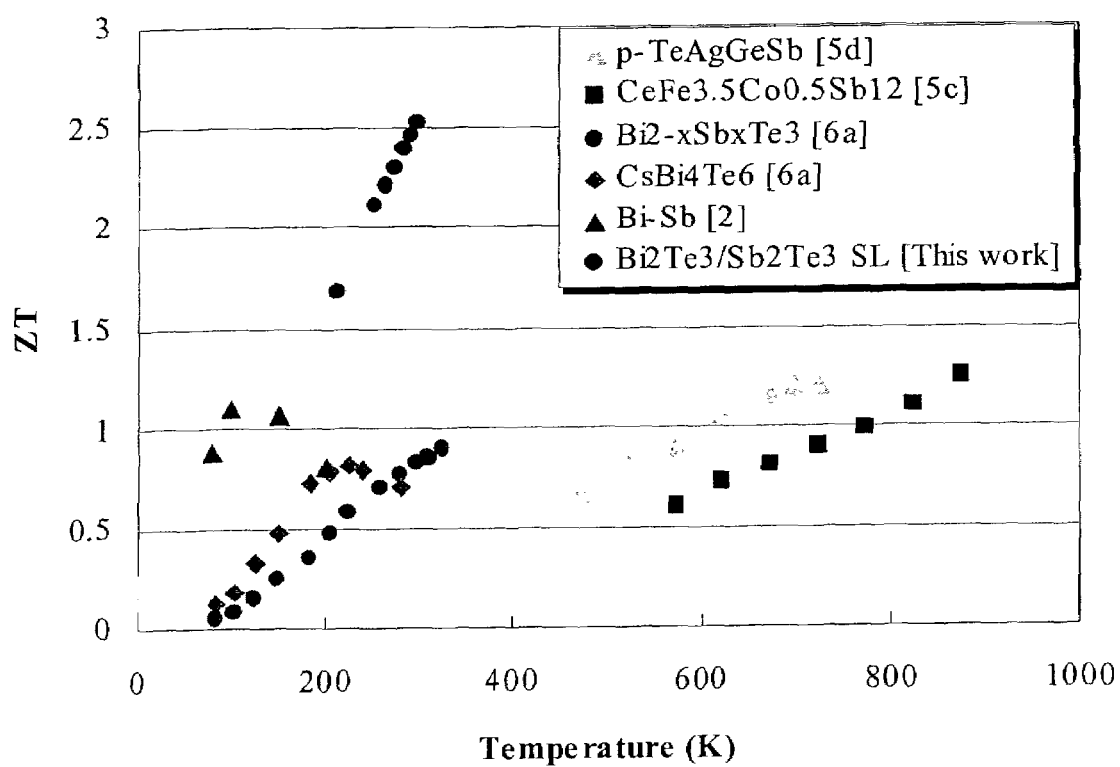
FIG. 4 is a graph depicting the temperature-dependence of Z of a 10 Å/50 Å p-type $Bi_2Te_3/Sb_2Te_3$ superlattice of the present invention, as compared to Z for those of several recently reported materials.

As proof-of-advantage that an enhanced ZT at lower temperatures can lead to more efficient cryogenic thermoelectric devices, U.S. Pat. Appl. No. 60/190,924 obtained 4 times the cooling with $Bi_2Te_3/Sb_2Te_3$ superlattice devices compared to bulk p-type $Bi_{2-x}Sb_xTe_3$ devices at 210K for similar aspect-ratio (1/a), thermal load/parasitics. FIG. 4 shows that the p-type 10 Å/50 Å $Bi_2Te_3/Sb_2Te_3$ superlattice offers improved ZT compared to $CsBi_4Te_6$ alloy at ~210K. See for example Chung, D. Y. et al., "A high-performance thermoelectric material for low-temperature application," Science vol. 287, pp. 1024-1027 (2000); the entire contents of which are incorporated herein by reference.

Phonon-Blocking Electron-Transmitting Structures

In the present invention, the phonon-blocking electron transmitting structures, such as for example 10 Å/50 Å $Bi_2Te_3/Sb_2Te_3$ superlattices, indicate that phonon and hole (charge-carriers) transport can be engineered to improve ZT. Other structures which showed a ZT>1 at 300K include the 10 Å/40 Å and 20 Å/40 Å $Bi_2Te_3/Sb_2Te_3$ superlattices of the present invention. Transport characteristics of phonons and holes described by a k-$1_{mfp}$ product can be compared as a measure of the amount of blocking (or lack of blocking) for phonons and holes, where k and $1_{mfp}$ are the average wave-vector and mean-free-path. See for example Venkatasubramanian, R. Lattice thermal conductivity reduction and phonon localization like behavior in superlattice structures. Phys. Rev. B vol. 61, pp. 3091-3097 (2000).

For holes, the thermal velocity ($v_{th}$), deBroglie wavelength and the wave-vector magnitude are estimated to ~2.1E7 cm/sec, ~114 Å, and ~5.5E6 cm$^{-1}$, respectively. From the relation $(1_{mfp})_\perp \sim (v_{th}m^*\mu_\perp/q)$, $(1_{mfp})_\perp$ is derived as 136 Å. (For the sample with $ZT_i$ ~2.34, a $\mu_\perp$ of 383 cm$^2$/V-sec is deduced from $\rho_\perp$ obtained from For an average phonon-wavelength of ~30 Å and hole deBroglie wavelength of ~114 Å, a $(k.1_{mfp})_{phonons}$~0.5 and a $(k.1_{mfp})_{holes}$~7.6 is obtained. This comparison may capture the phonon-blocking electron-transmitting nature of certain superlattices, leading to enhanced ZT.

N-type Superlattice Structures

Figure 5:
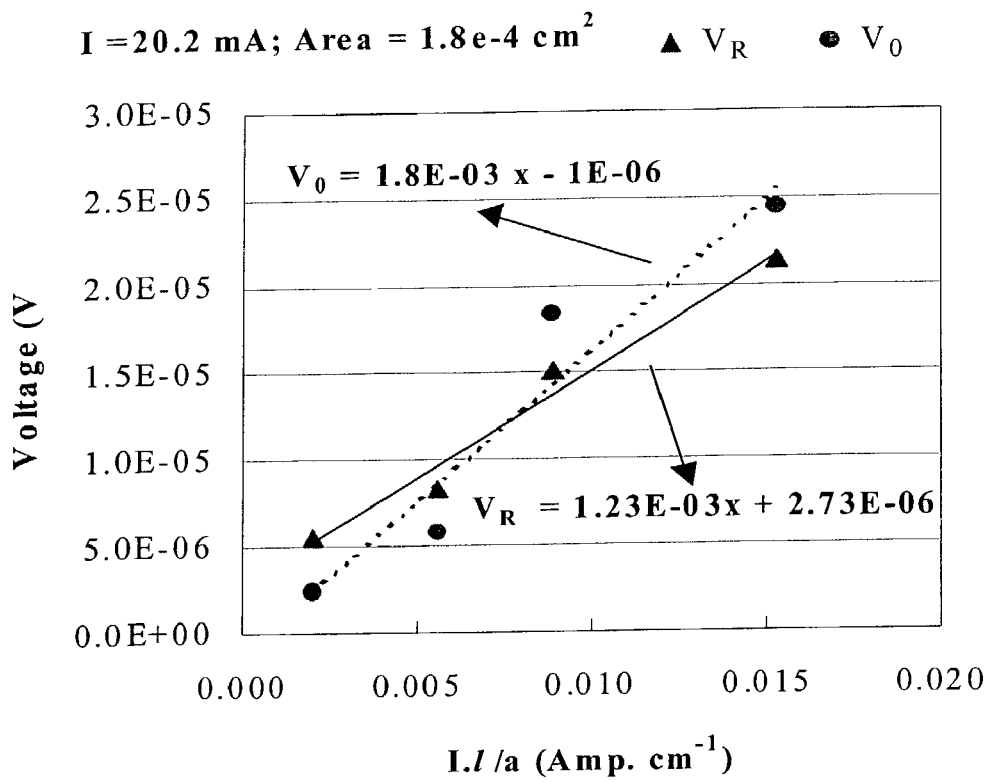
FIG. 5 is a graph depicting Ohmic and Peltier voltages across a thermoelement derived from a variable-thickness ZT measurement on a 10 Å/50 Å n-type $Bi_2Te_3/Bi_2Te_{2.85}Se_{0.15}$ superlattice of the present invention indicating an intrinisic ZT of 1.46.

ZT enhancement results of the present invention have been obtained with n-type 10 Å/50 Å $Bi_2Te_3/Bi_2Te_{2.83}Se_{0.17}$ superlattices of the present invention indicating a $ZT_i$>1 at 300K. The variable-thickness ZT measurements on these n-type superlattices shown in FIG. 5, similar to FIGS. 3B and 3C, indicate a $ZT_i$ of ~1.46 at 300K. The best extrinsic $ZT_e$ for an n-type device has been ~1.2 at 300K. The closeness of $ZT_i$ and $ZT_e$ is from $\rho_c$ of ~1.2E-8 Ohm-cm$^2$. Once again, low-resistivity contacts were obtained with Cr/Au/Ni/Au or Ni/Au metallizations. The cross-plane (along c-axis or along the trigonal axis) electrical resistivity in these n-type superlattices is ~1.23E-3 Ohm-cm, not significantly higher than the in-plane (along a-b axis) electrical resistivity of 1.04E-3 Ohm-cm. Thus, in the 10 Å/50 Å n-type superlattice structure, apparently because of weak-confinement/near-zero band-offset, there is minimal anisotropy between the in-plane and cross-plane electrical resistivities, similar to the 10 Å/50 Å (and other) p-type $Bi_2Te_3/Sb_2Te_3$ superlattices (FIG. 1C). This lack of anisotropy in electrical conductivity is also indicative of a miniband transport, arising from weak or negligible carrier confinement. The lack of electrical anisotropy in both the high-performance p-type and n-type superlattices, comparing a-b and c crystallographic axes, is in marked contrast to the electrical anisotropy observed in both p-type and n-type bulk materials.

The reason for the less-than-impressive $ZT_f$~1.46 at 300K in the 60 Å-period n-type $Bi_2Te_3/Bi_2Te_{2.83}Se_{0.17}$ superlattices, compared to $ZT_f$~2.4 at 300K in the best p-type $Bi_2Te_3/Sb_2Te_3$ superlattices, is the much higher $K_L$. From $\partial V_0/\partial$ (I 1/a) and an $\alpha$ of ~238 µV/K, a cross-plane $K_T$ of 9.45 mW/cm-K is estimated. Using Weidemann-Franz law and $\rho_\perp$ of 1.23E-3 Ohm-cm, an electronic thermal conductivity of ~3.7 mW/cm-K is obtained. Thus, the cross-plane lattice thermal conductivity is ~5.8 mW/cm-K.

This is more like the c-axis $K_L$ of bulk alloys and much higher than the low ~2.5 mW/cm-K observed in a 60 Å-period p-type $Bi_2Te_3/Sb_2Te_3$ superlattices which were reported in Phys. Rev. B 61, pp. 3091-3097 (2000). These results of the present invention indicate near-ideal superlattice interfaces in the $Bi_2Te_3/Sb_2Te_3$ system, where the compositional modifications of either Bi or Sb are accomplished within regions enclosed by the Te—Te van der Waals bond. Thus, in one preferred embodiment of the present invention, mirror-like (i.e. non-mixed) superlattice interfaces are obtained leading to potential reflection effects reducing $K_L$. In contrast, in the $Bi_2Te_3/Bi_2Te_xSe_{3-x}$ system, where both Se and Te are expected to be present at the van der Waals interface, it is anticipated that there will be substantial unintended compositional mixing. Thus, in that case, the lattice thermal conductivity is expected to be more typical of an alloy. This was corroborated by internal work showing a lack of significant improvement in electronic mobilities for n-type $Bi_2Te_3/Bi_2Te_{2.83}Se_{0.17}$ superlattices (as compared to n-type $Bi_2Te_{3-x}Se_x$ alloys), in contrast to a remarkable enhancement of carrier mobilities observed in p-type $Bi_2Te_3/Sb_2Te_3$ superlattices relative to p-type $Bi_{2-x}Sb_xTe_3$ alloys. See for example Venkatasubramanian, R. et al., Appl. Phys. Lett. vol. 75, pp. 1104-1106, (1999).

Therefore, enhancement of $ZT_t$ to 1.46 in n-type superlattices of the present invention (from ~1 for bulk n-type alloy) may be attributable to the lack of electrical-anisotropy and the typical lower lattice thermal conductivity associated with c-axis (~5.8 mW/cm-K compared to ~10 mW/cm-K along a-b axis). According to the present invention, more optimal n-type superlattices with low $K_L$ are possible in superlattices with minimal compositional mixing at the van der Waals interface. These improvements can be realized, according to the present invention, by improved growth interruption cycles between the growth of the two layers. Also superlattices such $Bi_2Te_3/As_2Te_3$, $Bi_2Te_3/PbTe$, $Bi_2Te_3/PbTeSe$ can be utilized, where negligible intermixing, as in $Bi_2Te_3/Sb_2Te_3$ superlattices, can be engineered.

The superlattice materials and processing of the present invention enable 40K cooling with micro-device elements exposed to a power flux of ~700 W/cm$^2$.

Figure 6:
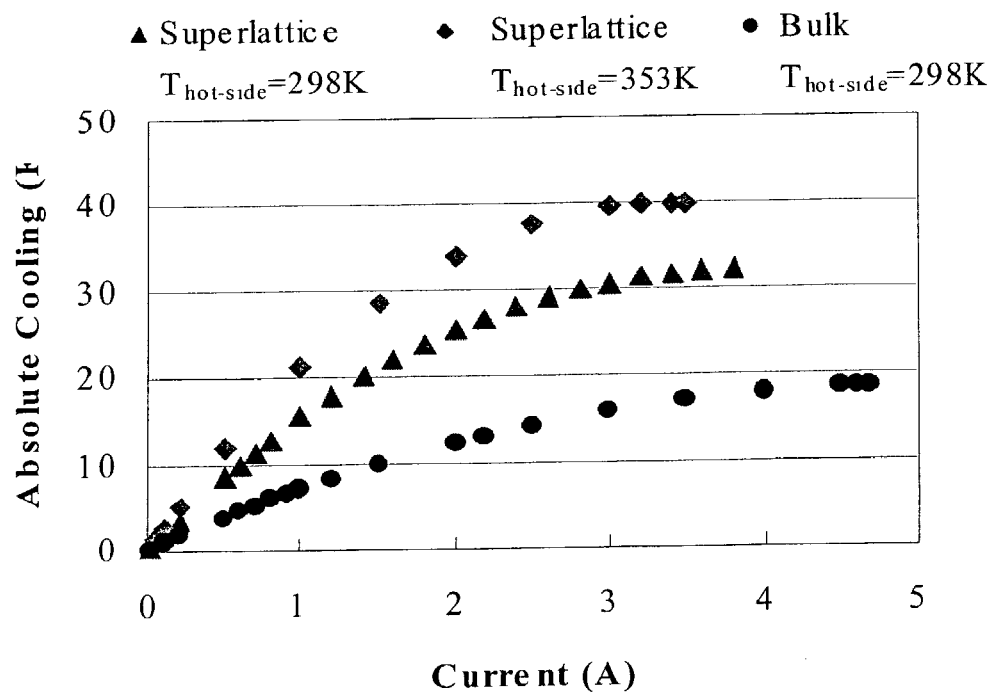
FIG. 6 is a graph depicting cooling in p-type $Bi_2Te_3/Sb_2Te_3$ superlattice thin-film devices of the present invention.

The graph of FIG. 6 depicts cooling in p-type $Bi_2Te_3/Sb_2Te_3$ superlattice thin-film devices according to embodiments of the present invention.

Figure 15:
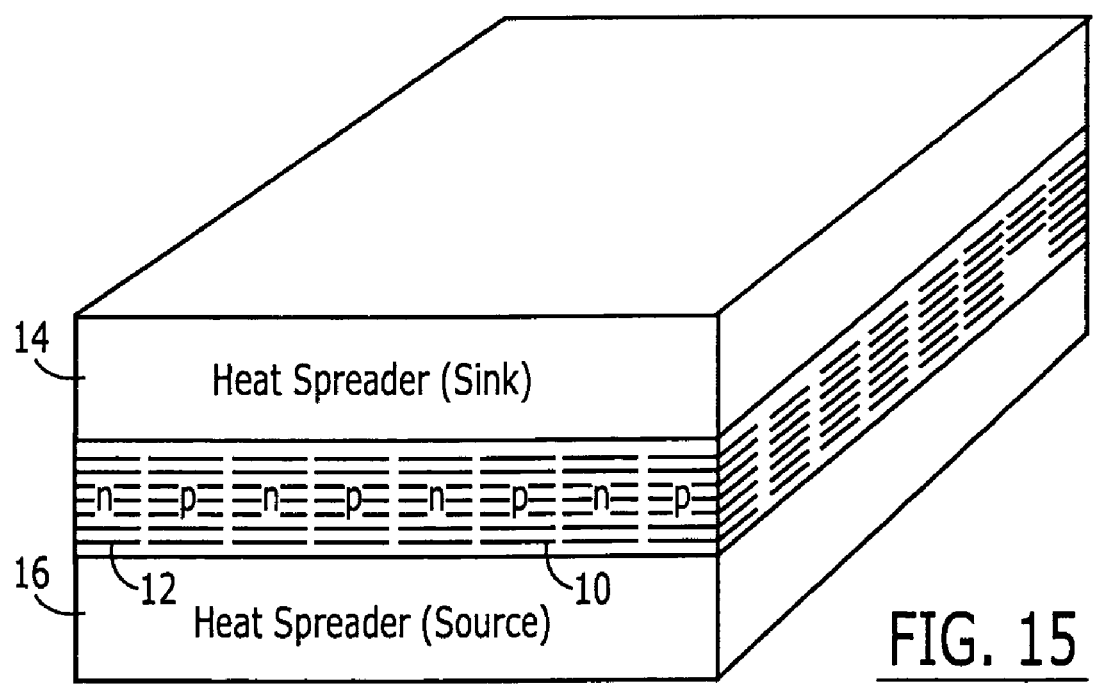
FIG. 15 is a schematic of a thermoelectric device of the present invention utilizing p and n type thermoelements having the phonon-blocking structures of the present invention.

FIG. 15 is a schematic of a thermoelectric device of the present invention utilizing p and n type thermoelements 10, 12, respectively, and having the phonon-blocking structures of the present invention. As shown in FIG. 15, the thermoelectric device of the present invention includes a heat source plate 14, a heat sink plate 16 operating at an elevated temperature with respect to the heat source plate 14, n-type thermoelectric elements 10 including the phonon-blocking structures of the present invention, and p-type thermoelectric elements 10 including the phonon-blocking structures and electrically connected in series to the n-type thermoelectric elements 12 to thereby conduct electrical charges.

Power Conversion with Thin-film Superlattice Devices

Thin-film micro-devices of the present invention were tested in a power-conversion mode. Superlattice thin-film devices of the present invention, including 10 Å/50 Å $Bi_2Te_3/Sb_2Te_3$ superlattices, 5.2 microns in thickness and patterned with an aspect ratio of height to surface area of 3 cm$^{-1}$, have been shown to develop a ΔT of 70K across the devices with a corresponding open-circuit voltage indicating an average α of ~243 µV/K. The ΔT translates into a temperature gradient of ~134,000 K/cm. The typical Seebeck coefficient suggests no unusual departure from classical behavior at these gradients.

Figure 7:
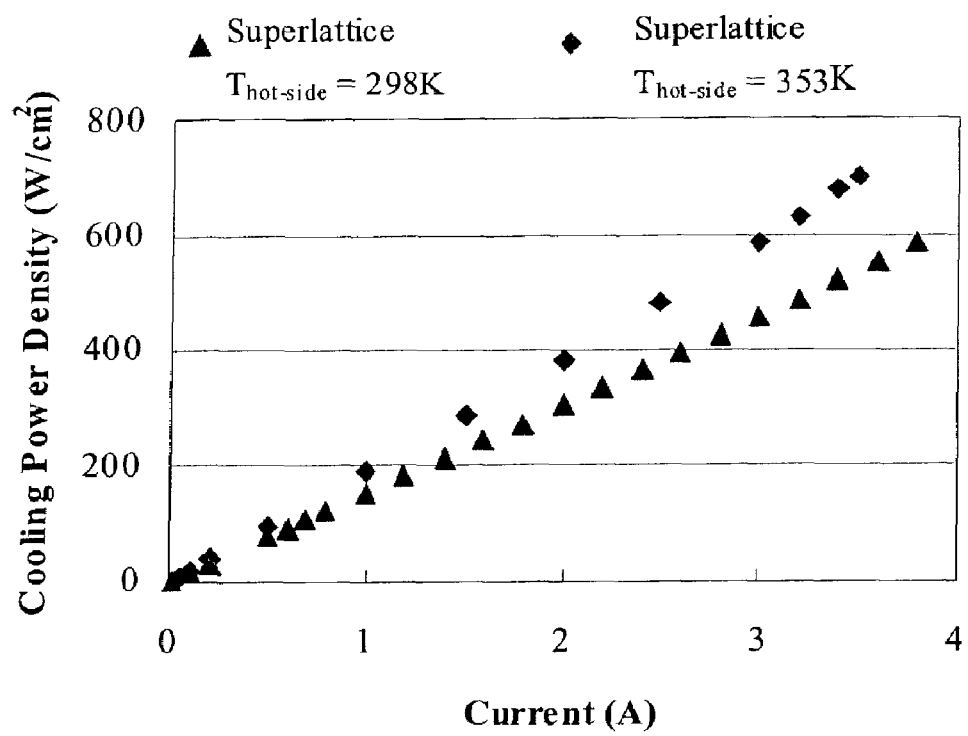
FIG. 7 is a graph depicting cooling power density in p-type $Bi_2Te_3/Sb_2Te_3$ superlattice thin-film devices of the present invention.
Figure 9:
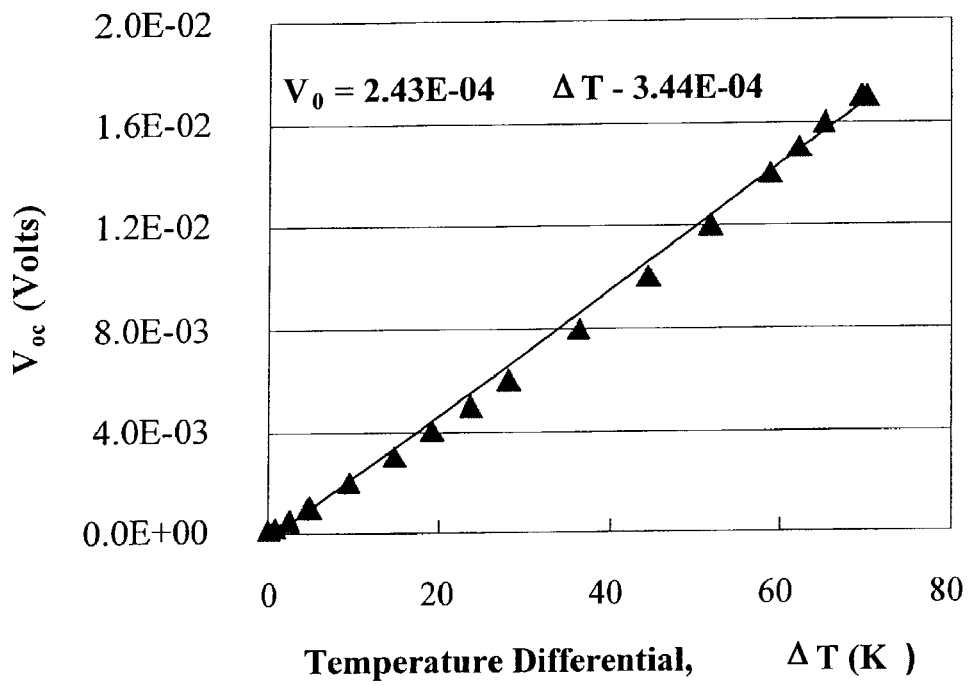
FIG. 9 is a graph depicting open-circuit voltage as a function of temperature differential in a thin-film superlattice device of the present invention.

Shown in FIG. 9 is the open-circuit voltage data as a function of ΔT in the thin-film superlattice mesa device. Note that a ΔT of as much 70K is obtained across a thermoelectric device, only 5.2 micron thick, as the area of the device has been proportionately reduced to about 1.76e-4 cm$^2$. Thus, this device aspect ratio (area/length) are typical of elements based on our thin-film device technology, see U.S. Pat. No. 6,300,150. Using the thin-film devices and the associated high ZT, the present invention can achieve modest power conversion efficiencies even at low ΔT as indicated in FIG. 7. According to the present invention, light-weight, high-power density, thin-film power conversion device modules are expected to be useful in advanced fuel-based portable power conversion systems and thermal scavenging applications.

Figure 8:
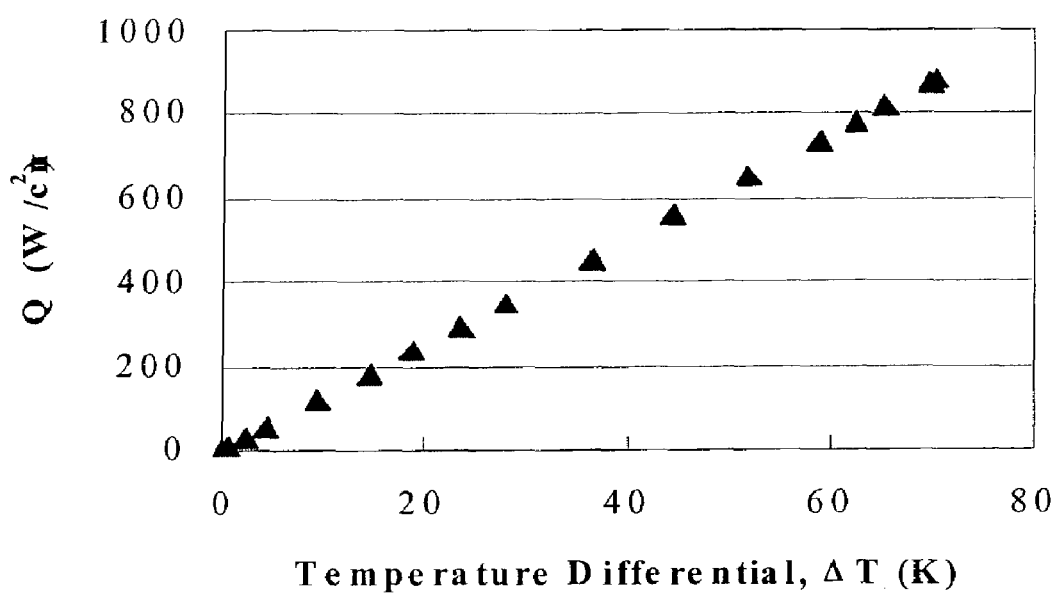
FIG. 8 is a graph depicting heat flux across a thin-film superlattice device of the present invention.

The graph of FIG. 8 depicts heat flux across a thin-film superlattice device according to embodiments of the present invention.

Figure 10:
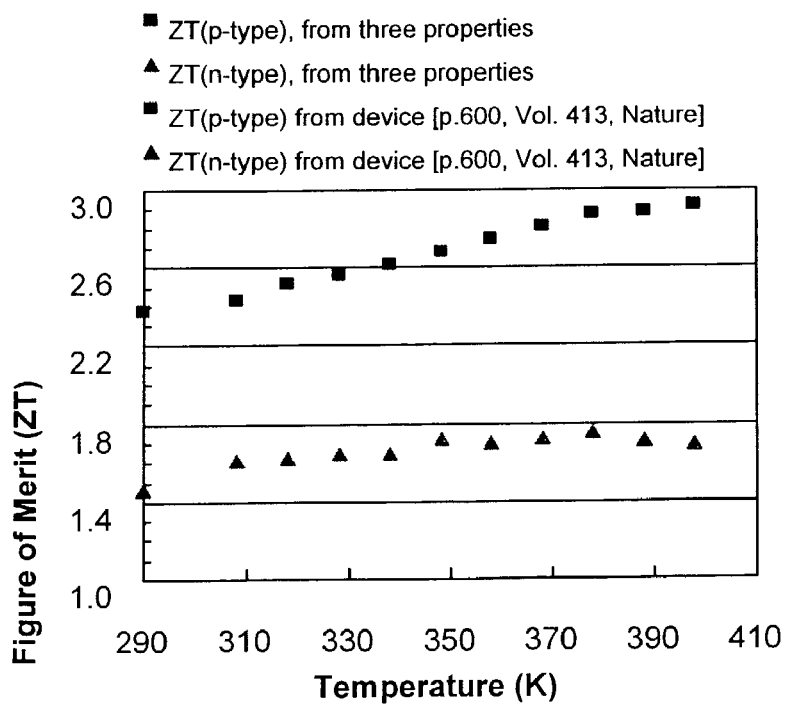
FIG. 10 is a graph of ZT as a function of temperature for one p-type 10 Å/50 Å $Bi_2Te_3/Sb_2Te_3$ superlattice of the present invention and an n-type 10 Å/50 Å $Bi_2Te_3/Bi_2Te_{2.85}Se_{0.15}$ superlattice of the present invention in the temperature range of 290 to 410K.

FIG. 10 includes a graph of ZT as a function of temperature for one p-type 10 Å/50 Å $Bi_2Te_3/Sb_2Te_3$ superlattice according to embodiments of the present invention and an n-type 10 Å/50 Å $Bi_2Te_3/Bi_2Te_{2.85}Se_{0.15}$ superlattice according to embodiments of the present invention in the temperature range of 290 to 410 K.

Figure 11:
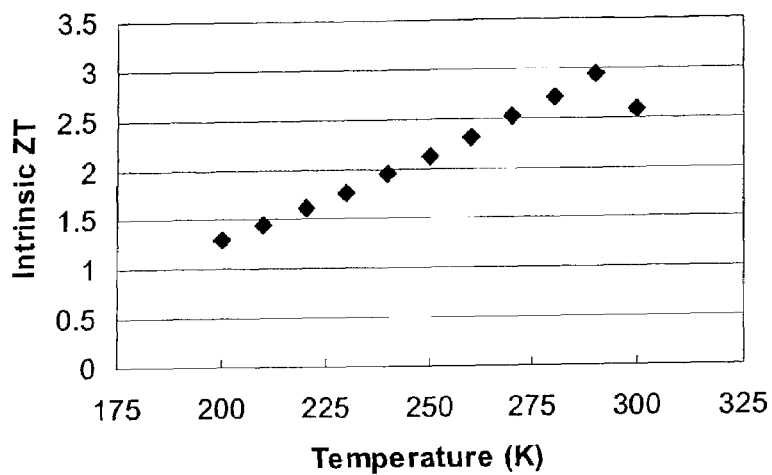
FIG. 11 is a graph depicting the temperature-dependence of ZT of an n-type 10 Å/40 Å $Bi_2Te_3/Bi_2Te_{2.85}Se_{0.15}$ superlattice of the present invention with a ZT of as much as ~2.58 at 300K with a peak ZT of ~2.93 occurring around 290K.

The graph of FIG. 11 depicts the temperature-dependence of ZT of an n-type 10 Å/40 Å $Bi_2Te_3/Bi_2Te_{2.85}Se_{0.15}$ superlattice of the present invention with a ZT of as much as ~2.58 at 300K with a peak ZT of ~2.93 occurring around 290K.

The thin-film thermoelectric technology can be implemented in a modular approach. This implies the extension of the device technology of the present invention into thin-film thermoelectric heat-pump units or power conversion devices scaled for various heat load capacities. Several concepts needed for such modules, like bonding of thin-films to heat-sink, removal of substrate, photo-lithography to achieve appropriate 1/a, low-resistivity contacts and preserving the extraordinary properties of the as-grown nanometer-superlattices during detailed processing are demonstrated by the results of the present invention.

The $Bi_2Te_3/Sb_2Te_3$ material system, according to the present invention, is an example of a material system for growing superlattices that have the potential for ideal superlattice interfaces. Thin-film growth techniques like molecular beam epitaxy (MBE) or metal organic chemical vapor deposition (MOCVD (well known in the art) can produce, according to the present invention, films that are oriented along the c-axis, the c-axis of the material being arranged perpendicular to the substrate surface.

Also the $Bi_2Te_3$ and related chalcogenide materials have a periodic van der Waals (VWB) gap along the trigonal or c-axis. See for example Numerical Data and Functional Relationships in Science and Technology, Landolt-Bornstein series, Vol. 17, (Springer, Berlin, 1983). Thus, growth of such films occurs with VWB gaps along the growth axis. The presence of VWB along the growth axis is highly desirable for obtaining abrupt surface terminations. See for example O. Lang, R. Schlaf, Y. Tomm, C. Pettenkofer, and W. Jagermann, J. Appl. Phys. Vol. 75, pp. 7805, (1994).

According to the present invention, the $Bi_2Te_3$ and related chalcogenide materials can be produced with high-quality interfaces in spite of a significant lattice mismatch in the plane of the epitaxy. The present invention, by choosing superlattice components with a lattice mismatch, a significant acoustic mismatch is realized. At the same time, the superlattice components are such that there exist only small band offsets to impede the transport of electrical carriers. The schematic of the heterojunction band diagram for the $Bi_2Te_3/Sb_2Te_3$ junction is shown in FIG. 1A as an example.

A similar choice of optimal heterojunction material combinations can be conceived with many other material systems. These material systems, according to the present invention, can include but are not limited to thin films of bulk thermoelectric materials known to those in the art. Further the use of the non-alloyed components in the superlattice instead of the alloy also can reduce the alloy scattering of carriers. Thus, ideal carrier transport according to the present invention is enabled by minimizing interface carrier scattering due to the VWB along the growth axis which leads to very few defects in spite of the lattice mismatch. Accordingly, in one preferred embodiment, a pure or unalloyed component for the superlattice is chosen to avoid alloy scattering of carriers.

According to the present invention, a phonon blocking and electron transmitting structure can include:

1) Two material systems that have sufficient lattice mismatch either in the plane of epitaxy or perpendicular to the plane of epitaxy. This mismatch will invariably lead to an acoustic mismatch. The acoustic mismatch from a unit to unit along the heat flow direction is important in reducing lattice thermal conductivity.

2) A nanostructured thermoelectric material where the concept of reducing the phonon or heat transport, thereby reducing the lattice thermal conductivity, and simultaneously enhance (or not degrade) electrical transport, both with respect to a comparable alloy where such nanostructures are not utilized, to achieve an enhanced three-dimensional figure-of-merit (ZT) over the comparable alloy.

3) A nanostructured thermoelectric material where the concept of reducing the phonon or heat transport, thereby reducing the lattice thermal conductivity, and simultaneously enhance (or not degrade) the electron or electricity transport, and wherein no substantial quantum confinement effects are employed as revealed by the lack of Seebeck coefficient enhancement from enhanced density of states from quantum-confinement effects as discussed in Hicks, L. D. & Dresselhaus, M. D. Effect of quantum-well structures on the thermoelectric figure of merit. Phys. Rev. B 47, pp. 12727-12731 (1993), both with respect to a comparable alloy where such nanostructures are not utilized, to achieve an enhanced three-dimensional figure-of-merit (ZT) over the comparable alloy.

4) A nanostructured thermoelectric material where the concept of reducing the phonon or heat transport may be small, but the simultaneous enhancement of the electrical transport by the removal of electrical anisotropy through a mini-band formation, both with respect to a comparable alloy where such nanostructures are not utilized, achieves an enhanced three-dimensional figure-of-merit (ZT) over the comparable alloy 5) Two material systems that have van der Waals like bonding along the growth axis so that the lattice mismatch can be accommodated with very little defects such a dislocations that tend to disrupt the flow of electricity or charge carriers. Thus, these defects are not a major source of phonon scattering because defects also scatter the electrical carriers.

6) Two material systems that have minimal band offsets, like energy offsets within kT at room temperature. For example, in the p-$Bi_2Te_3/Sb_2Te_3$ superlattice system, the offset is small. The effect of the band offset can further be reduced by choosing component dimensions less than a unit cell like 10 Å $Bi_2Te_3$ in a 10 Å/50 Å superlattice or 20 Å $Bi_2Te_3$ in a 20 Å/40 Å superlattice, while keeping the period of the unit cell same. Note that a 30 Å/30 Å superlattice, with the same period of 60 Å, has a similar phonon blocking characteristic as 10 Å/50 Å or 20 Å/40 Å but with much higher electrical resistivity.

7) A materials system having a conduction miniband, but the conduction miniband is applied in a superlattice for electrical current transport along the VWB direction to overcome the electrical anisotropy.

More specifically and in preferred embodiments, the present invention separately or in combination utilizes:

1) Superlattices in the $Bi_2Te_3/Sb_2Te_3$ material system oriented along C-axis so that the VWB's are along the growth axis.

2) $Bi_2Te_3$ buffer between a GaAs growth-substrate and a $Bi_2Te_3/Sb_2Te_3$ superlattice of the present invention so that high quality epitaxial growth, prior to substrate removal, is possible.

3) Superlattice properties of a) total thermal conductivity of 5 to 12 mW/cm-K with lattice contribution of only 2.5 mW/cm-K, Seebeck coefficients of ~200 to 250 µV/K, and electrical resistivities of 0.5 mOhm-cm to 1.5 mOhm-cm along the c-axis. Superlattice structures with a) total thermal conductivity of 5 to 20 mW/cm-K with lattice contribution of only 1 to 6 mW/cm-K, Seebeck coefficients of ~175 to 350 µV/K, and electrical resistivities of ~0.25 mOhm-cm to 3 mOhm-cm along the c-axis can also, according to the present invention, enhance ZT.

4) Superlattice periods in a preferred range of 50 to 60 Å lead to a minimum in lattice thermal conductivity in the $Bi_2Te_3/Sb_2Te_3$ and $Bi_2Te_3/Bi_2Te_{3-x}Se_x$ system. $K_L$ for all the 60 Å-period $Bi_2Te_3/Sb_2Te_3$ superlattice structures, whether it be 30 Å/30 Å or 10 Å/50 Å or 20 Å/40 Å, is about 0.25 W/m-K. However, the present invention is not restricted to this preferred range of superlattice periods, but as shown herein, will be practiced such that for a given superlattice materials system the periodicity is optimized with respect to minimizing lattice thermal conductivity. While $K_L$ appears to be more dependent on the superlattice period, relatively independent of the thickness of the constituents, while the electronic transport depends on the period and the relative thickness of the constituents.

5) Seebeck coefficient, confirmed by variable thickness ZT measurements and related measurements, of the cross-plane Seebeck coefficient is almost same as in-plane Seebeck coefficient, based on power device data.

6) At least two material systems having a superlattice with a sufficient lattice mismatch in the plane of epitaxy to result in an acoustic mismatch. The acoustic mismatch from a unit to unit along the heat flow direction is important in reducing lattice thermal conductivity. Here, the optimum period to minimize $K_L$, as seen in the contrast between $Bi_2Te_3/Sb_2Te_3$ versus $Bi_2Te_3/Bi_2Te_{2.85}Se_{0.15}$ superlattices, should provide a VWB with clean, abrupt interfaces.

7) At least two material systems in a superlattice that have van der Waals like bonding along the growth axis. In such systems, the lattice mismatch is accommodated with very few defects that deteriorate electrical transport.

8) At least two material systems, for operation at an average absolute temperature T, such that the two material systems have minimal band offsets, like within kT, where k is the Boltzmann constant. For example, in the p-$Bi_2Te_3$/$Sb_2Te_3$ superlattice system, the offset is small. The effect of offset can be further reduced by choosing component dimensions less than a unit cell like 10 Å $Bi_2Te_3$ in a 10 Å/50 Å superlattice or 20 Å $Bi_2Te_3$ in a 20 Å/40 Å superlattice, while keeping the period same. Note that the 30 Å/30 Å superlattice, with the same period of 60 Å, has similar phonon blocking characteristic as 10 Å/50 Å or 20 Å/40 Å but also has a much higher electrical resistivity. Miniband conduction could be utilized in a superlattice structure of the present invention, for current transport along the VWB direction, to overcome the electrical anisotropy.

10) Preferably pure or unalloyed components for the superlattice to avoid alloy scattering of carriers.

11) Phonon-blocking electron transmitting structures (PBETS) under high-pressure to increase the ZT further. The pressure can be realized, according to the present invention, by including chemical dopants into the PBETS to generate misfit-induced pressure.

12) Phonon-blocking electron transmitting structures (PBETS) under a magnetic field to increase the ZT further. The magnetic filed can be realized, according to the present invention, by including as chemical dopants magnetic materials into the PBETS to generate misfit-induced pressure.

13) Ultra-low specific contact resistivity Ohmic contacts applied to either end of a thin-film thermoelectric device. Typical Ohmic metallizations could be Cr/Au/Ni/Au and/or Ni/Au. The use of Cr helps in adhesion while Ni is used for reducing inter-diffusion of bonding materials such as $Pb_xSn_{1-x}$ alloys during device fabrication. As an example, the thickness of Cr can range from 100 Angstroms to several microns and the thickness of Ni can range from 100 Angstroms to several microns. Specific contacts in the range of $10^{-7}$ Ohm-cm$^2$ to $10^{-8}$ Ohm-cm$^2$ or lower so that device ZT ($ZT_e$) approaches intrinsic ZT ($ZT_i$) as discussed above.

14) The thin-film thermoelectric cooling modules, based on these superlattices or other thermoelectric materials, located on the backside of dynamic random access memory (DRAM) chips to make the chips operable as static random access memory (SRAM) chips or to cool a microprocessor chip, a laser chip, or a superconducting chip or to cool an object as in refrigeration or air-conditioning. Thus, the thermoelectric cooling modules can be used to cool heat exchangers in refrigerators or air conditioners.

15) Low temperature grown $Bi_2Te_3/Sb_2Te_3$ superlattices, as described for example in U.S. Pat. No. 6,071,351 to be carried out below 190° C., allowing application of these high-performance thermoelectric modules, in a monolithic fashion, to convert dynamic random access memory (DRAM) chips to static random access memory (SRAM) or to cool a microprocessor chip, a laser chip, or a superconducting chip, or to cool an object as in refrigeration or air-conditioning.

Figure 12:
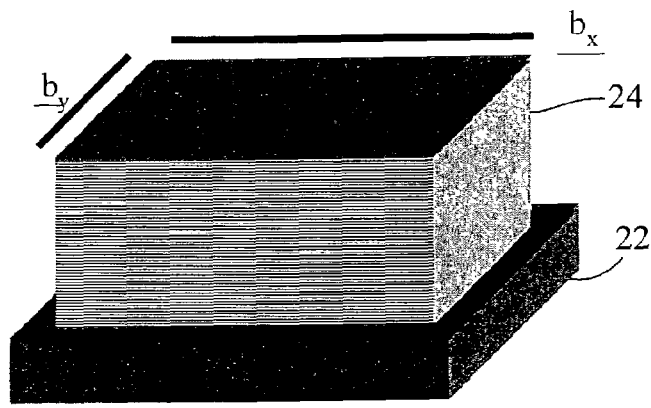
FIG. 12 is a schematic depicting the formation, from a thin film superlattice structure, an one-dimensional superlattice phonon-blocking structure of the present invention.
Figure 12:
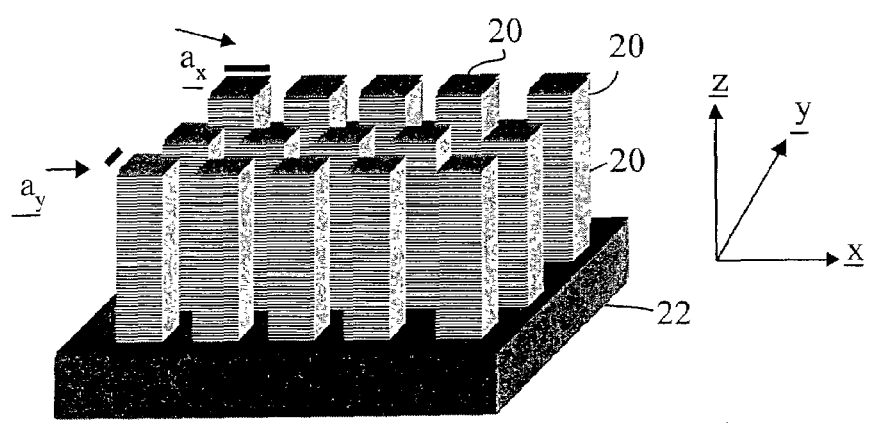

16) Low-dimensional (10 Å to 100 Å) type phonon-blocking, electron-transmitting structures, formed from superlattices (i.e., low-dimensional in one axis out of three possible orthogonal axes) implemented in quantum-wires and carbon nano-tubes (i.e., low-dimensional along two orthogonal axes) as well as in quantum-dots or nano-dots or quantum-boxes (i.e., low-dimensional along three orthogonal axes). In the case of quantum-wires, these could be an assemblage of one or more mesa structures 20 shown for example in FIG. 12b formed on a growth substrate 22, where the cross-sectional dimensions of the mesa are in the range of 10 to 1000 Angstroms, denoted as $a_x$ and $a_y$ in FIG. 12b. FIG. 12a shows the transition of a large-area (along x and y axes) superlattice structure 22 along a z-axis, into a wire along the z-axis. Note that, in spite of the periodic superlattice structure along z-axis, that reduces thermal conductivity along z-axis, the electric current flow along z-axis is not impeded or deteriorated along the z-axis. Thus in both FIGS. 12a and 12b, heat is impeded along z-axis by the phonon-blocking superlattices in the mesa structures 20 or the superlattice structure 22, but the proper choice of band offsets of the materials that constitute the superlattices is such that the electric current flow is not impeded along the z-axis.

According to the present invention, a miniband conduction of electrons (in n-type) or holes (in p-type) is formed along the z-axis. Note that in FIG. 12b, in contrast to FIG. 12a, the lateral size-confinement (along x and y-axis) can lead to Seebeck coefficient enhancement. Thus, according to the present invention, phonon-blocking electron transmitting structures with low-dimensionality, cause quantum-confinement along x and y-axes orthogonal to the current and heat flow. These orthogonally-quantum-confined super-lattice phonon-blocking electron-transmitting structures benefit from a thermal conductivity reduction in the direction of heat flow without deterioration or actual enhancement of electrical transport along the direction of heat flow (along z-axis in the example shown in FIG. 12b) while at the same time benefit from enhanced density of states from lateral confinement in the x,y plane, thereby improving the Seebeck coefficient.

The present invention recognizes the difficulty in the fabrication of structures with $a_x$ and $a_y$ in the range of 10 to 1000 Angstroms to provide the lateral confinement. According to the present invention, electron beam lithography-based reactive ion etching (that leads to vertical walls) or self-assembly processes, both well known in the art can be utilized to form the precise structures.

Figure 13A:
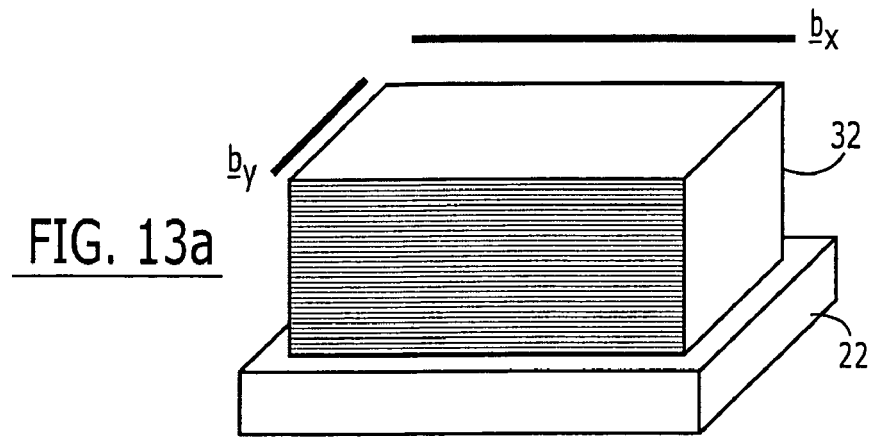
FIGS. 13A and 13B are schematic depicting the formation, from a thin film superlattice structure, a quantum dot or quantum box superlattice phonon-blocking structure of the present invention.
Figure 13B:
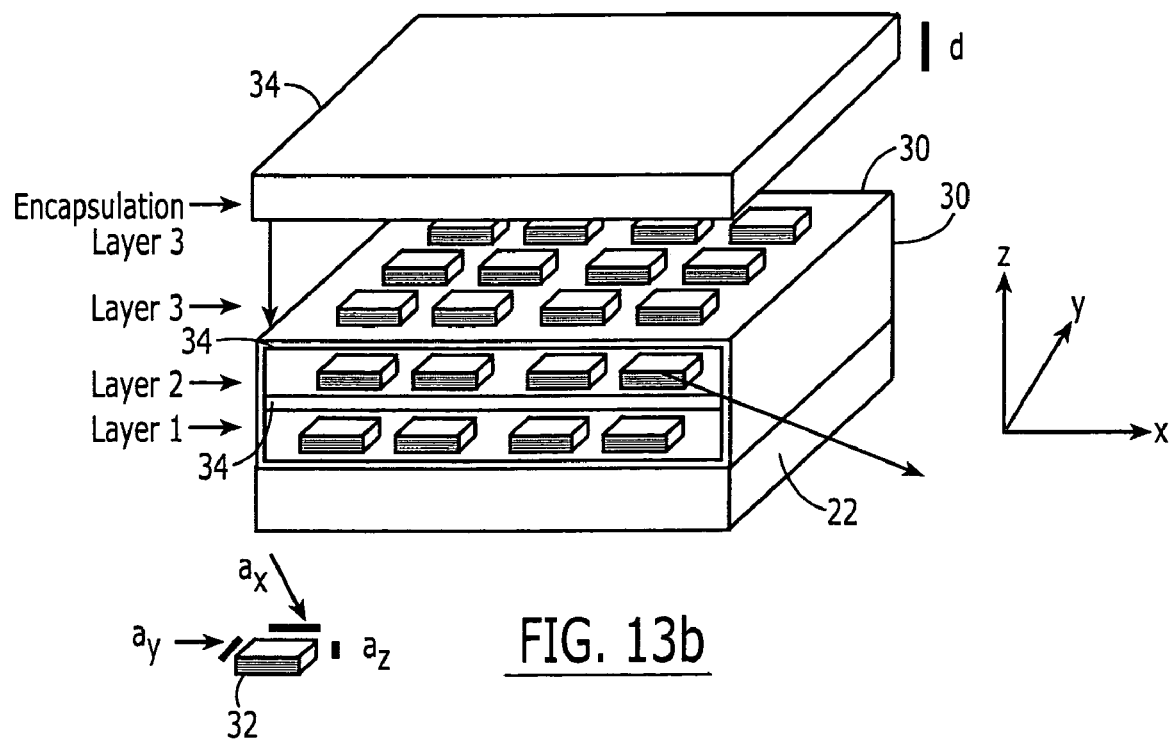

In another preferred embodiment, orthogonally-quantum-confined superlattice phonon-blocking electron-transmitting structures 32 include orthogonally-quantum-confined, nano-dots or quantum-dots or quantum-boxes 30 with superlattice phonon-blocking electron-transmitting structures 32 stacked along the z-axis shown in FIGS. 13a and 13b. These phonon-blocking electron-transmitting structures are achievable with self-assembly of the nano-dots or quantum-dots or the quantum-boxes 30 during growth by a chemical vapor deposition or a wet-chemistry process on a substrate 22. The self-assembly utilizes a periodic encapsulation layer 34 between layers of quantum boxes 30. Each encapsulation layer 34 is a moderate electrical and thermal conductor such as for example GaAs. As shown in FIG. 13b, a high packing fraction (40 to 80%) or volume fraction (40 to 80%) of these orthogonally-quantum-confined, nano-dots or quantum-dots or quantum-boxes 30 with superlattice phonon-blocking electron-transmitting structures 32 in the overall matrix of the encapsulation layer 34 is preferred.

Figure 14A:
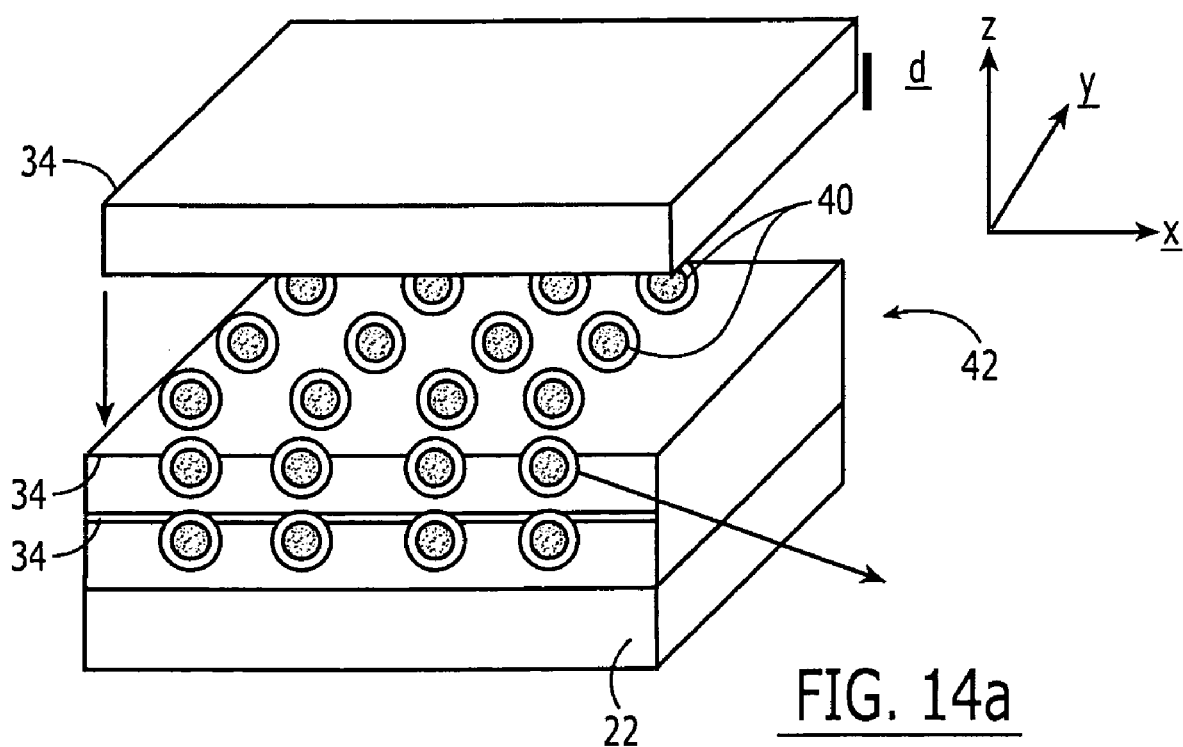
FIGS. 14A and 14B are schematics depicting a quantum dot structure superlattice phonon-blocking structure of the present invention.
Figure 14B:
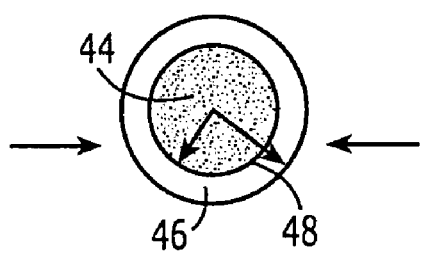

In another preferred embodiment, orthogonally-quantum-confined phonon-blocking electron-transmitting structures 42 of the present invention include orthogonally quantum-confined, sphere-like, nano-dots or quantum-dots or quantum-boxes 40 stacked in layers along the z-axis shown in FIGS. 14a and 14b. These structures are achievable with self-assembly of the nano-dots or quantum-dots or the quantum-boxes 40 during growth by chemical vapor deposition or wet-chemistry processes, with a periodic encapsulation layer 34 which is a moderate electrical and thermal conductor such as for example GaAs. As shown in FIG. 14a, a high packing fraction (40 to 80%) or volume fraction (40 to 80%) of these orthogonally-quantum-confined, sphere-like nano-dot or quantum-dot or quantum-box 40 with phonon-blocking electron-transmitting structures 42 in the overall matrix of the encapsulation layer 34 is preferred. As shown in the inset of FIG. 14b, the sphere-like quantum dots 40 include a central core material 44 and a peripheral material 46. The interfaces between these materials constitute, according to the present invention, a phonon-blocking, electron-transmitting interface 48, and the arrangement (i.e., the packing) provides the requisite phonon-blocking electron-transmitting structure 42.

The sphere-like layered structures can be obtained using solution growth of first layer, followed by solution growth of the second layer. The two-layered process can be repeated many times, if necessary, two create multi-layered spheres as well. These layered spheres can then be transferred onto the substrate and covered with the encapsulation template. This step can be repeated many times to create 1 to 100-micron thick films which will behave like orthogonally quantum-confined, phonon-blocking electron transmitting structures.

All the characteristics described above can be implemented in engineered bulk materials, if ways to form natural superlattices or natural quantum-wires or quantum-dots are developed. For example, materials such as PbTe, PbSe, and other similar materials can potentially form these structures, naturally, in bulk form. Other potential approaches in this regard may include spinodal decomposition, natural ordering, etc. in bulk materials. Approaches that can encourage these structures in bulk materials may include rapid heating/quenching to create stable meta-stable phases and inclusions.

In the present invention, a thermoelectric device with ZT of ~2.4 can operate as a thermoelectric cooler with a hot side $T_{hot}$~100° C., and still maintain $T_{cold}$~0 to 20° C., in a single stage cooler. Thus the thermoelectric cooler of the present invention is applicable to air-conditioning and refrigeration needs, and simplifies heat-removal at the hot-side using phase-change of water, a common and a very effective heat-transport liquid. For example, thin-film micro-devices of the present invention were tested in a power-conversion mode. $Bi_2Te_3/Sb_2Te_3$ superlattice thin-film devices of the present invention, 5.2 microns in thickness, have been shown to develop a temperature differential, dT, of 70K across the devices with a corresponding open-circuit voltage indicating an average Seebeck coefficient of 243 microV/K. The dT translates into a temperature gradient of ~134,000 K/cm. The typical Seebeck coefficient suggests no unusual departure from classical behavior at these gradients. Thus the phonon-blocking, electron transmitting superlattice structures, such as those described here, are likely to be characterized by Seebeck coefficients not different from comparable alloys. However, if as described in the case of orthogonally confined phonon-blocking electron transmitting structures, they may have higher Seebeck coefficients than comparable alloys.

The superlattices of the present invention are preferably formed during MOCVD growth, for high ZT, using the low-temperature growth as discussed in U.S. Pat. No. 6,071,351. The lower substrate-temperature during growth, typically reduced by about 50 to 150° C. from the cracking temperature of 350° C. as discussed in U.S. Pat. No. 6,071,351, leads to lower lattice thermal conductivity of 2.5 mW/cm-K in p-type 10 Å/50 Å $Bi_2Te_3/Sb_2Te_3$ superlattice along the c-axis compared to about 5 to 6 mW/cm-K for the 10 Å/50 Å $Bi_2Te_3/Sb_2Te_3$ superlattice grown directly on a susceptor (as discussed in U.S. Pat. No. 6,071,351) due to the higher substrate temperatures. In addition, the higher substrate temperatures lead to higher electrical resistivity in the superlattices along the c-axis, from the lack of absence of electrical anisotropy. Thus the lower lattice thermal conductivity, the higher electrical resistivity along the c-axis than along a-b axis, and the concomitant increase in ZT realized in the present invention, are an indication that the lower substrate temperatures employed during growth is beneficial. Of course, the lower substrate temperatures can be achieved in many ways known to the skilled in the art.

Numerous modifications and variations of the present invention are possible in light of the above teachings. It is therefore to be understood that within the scope of the appended claims, the invention may be practiced otherwise than as specifically described herein.

The invention claimed is:

1. A thermoelectric structure comprising:
    a superlattice film of at least first and second material systems having different lattice constants and interposed in contact with each other;
    a physical interface at which said at least first and second material systems are joined with a lattice mismatch and at which structural integrity of said first and second material systems is maintained;
    said superlattice film of at least first and second material systems having a charge carrier transport direction normal to said physical interface and the superlattice film having a thickness of at least approximately 1.35 μm wherein said superlattice film of at least first and second material systems and said physical interface comprise a superlattice structure with the lattice mismatch at said interface occurring in a plane of epitaxial growth of said at least two material systems and providing an acoustic mismatch to reduce thermal conduction across said physical interface; and
    orthogonally-quantum-confined superlattice phonon-blocking electron-transmitting structures.

2. The structure of claim 1, comprising:
    at least one of a quantum wire, a quantum dot, a nano-dot, and a quantum box.

3. The structure of claim 2, comprising:
    carbon nano-tubes included in said at least first and second material systems and comprising quantum wires.

4. The structure of claim 1, comprising:
an orthogonally quantum-confined nano-dot, quantum-dot, or quantum-box.

5. A thermoelectric device comprising:
a heat source plate;
a heat sink plate operating at an elevated temperature with respect to the heat source plate;
at least one n-type thermoelectric element including,
an n-type superlattice film of at least first and second n-type material systems having different lattice constants and interposed in contact with each other,
a physical interface at which said at least first and second n-type material systems are joined with a lattice mismatch and at which structural integrity of said first and second n-type material systems is maintained, and
said superlattice film of at least first and second n-type material systems having a charge carrier transport direction normal to said physical interface;
at least one p-type thermoelectric element electrically connected in series to said at least one n-type thermoelectric element, the at least one p-type thermoelectric element including,
a p-type superlattice film of at least first and second p-type material systems having different lattice constants and interposed in contact with each other,
a physical interface at which said at least first and second p-type material systems are joined with a lattice mismatch and at which structural integrity of said first and second p-type material systems is maintained, and
said p-type superlattice film of at least first and second p-type material systems having a charge carrier transport direction normal to said physical interface and the p-type superlattice film having a thickness of at least approximately 1.35 μm:
wherein at least one of the n-type and/or p-type superlattice films comprises an epitaxial superlattice film.

6. The device of claim 5, further comprising:
ohmic contacts to the at least one n-type thermoelectric element and the at least one p-type thermoelectric element.

7. The device of claim 6, wherein the ohmic contacts include Cr.

8. The device of claim 6, wherein the ohmic contacts include at least one adhesion promoter.

9. The device of claim 8, wherein the adhesion promoter includes one or more metals selected from Cr, NiCr, Ti, Mo, W, and alloys containing these metals.

10. The device of claim 6, wherein the ohmic contacts include at least one diffusion barrier.

11. The device of claim 10, wherein the diffusion barrier includes one or more metals selected from Ni, Cr, NiCr, Pd, Fe, and alloys containing these metals.

12. The device of claim 11, wherein the ohmic contacts have a resistivity less than $10^{-7}$ Ohm-cm$^2$.

13. The device of claim 6, wherein the ohmic contacts comprise Ohmic metallizations of at least one of Cr, Au, Ni, and Au.

14. The device of claim 13, wherein the ohmic metallizations include one or more metals selected from the group consisting of Au, Cu, Ni, Ag, Pd, Pt, Al, Ga, In, and alloys containing these metals.

15. The device of claim 14, wherein the ohmic contacts have a resistivity less than $10^{-7}$ Ohm-cm$^2$.

16. The device of claim 5, wherein the thermoelectric device is a thermoelectric cooler.

17. The device of claim 16, wherein the thermoelectric cooler comprises at least one of a refrigerator and an air conditioner.

18. The device of claim 5, wherein the thermoelectric device is a power conversion device.

19. The device of claim 5, further comprising:
a pressurizing mechanism including chemical dopants in thermoelectric nanostructures of the at least first and second material systems, said chemical dopants configured to generate a misfit-induced pressure in the thermoelectric structure.

20. The device of claim 5, further comprising:
a magnetizing mechanism including chemical dopants in thermoelectric nanostructures of the at least first and second material systems, said chemical dopants including magnetic materials.

21. A dynamic random access memory including the thermoelectric devices of any one of claims 5, 19, and 20 configured as at least one cooler.

22. The memory of claim 21, wherein the dynamic random access memory is configured as a static random access memory.

23. A thermoelectric device according to claim 5 wherein the p-type superlattice film has a thickness in the range of about 2.67 μm to approximately 5.4 μm.

24. A thermoelectric device according to claim 5 wherein the p-type superlattice film has a thickness of at least approximately 2.67 μm.

25. A thermoelectric power conversion device comprising:
a superlattice film of at least first and second material systems having different lattice constants and interposed in contact with each other;
a physical interface at which said at least first and second material systems are joined with a lattice mismatch and at which structural integrity of said first and second material systems is maintained;
said superlattice film of at least first and second material systems having a charge carrier transport direction normal to said physical interface and the superlattice film having a thickness of at least approximately 1.35 μm;
a heat sink connected to the superlattice film of at Least first and second material systems;
a heat source connected to the heat sink through the superlattice film of at least first and second material systems;
electrodes connected to the superlattice film of at least first and second material systems and configured to output a thermoelectric voltage; and
a magnetizing mechanism including chemical dopants in thermoelectric nanostructures of the at least first and second material systems, said chemical dopants including magnetic materials.

26. The device of claim 25, wherein said heat sink comprises a cold side of 250 K to 310K and said heat source comprises a hot side of 310K to 450K.

27. The device of claim 25, wherein the thermoelectric device has a ZT of at least 1.4.

28. The device of claim 25, further comprising:
a pressurizing mechanism including chemical dopants in thermoelectric nanostructures of the at least first and second material systems, said chemical dopants configured to generate a misfit-induced pressure in the structure.

29. The device of claim 25, wherein said heat sink is configured as a heat exchanger in a refrigerating unit.

30. The device of claim 25, wherein said heat sink is configured as a heat exchanger in an air conditioning unit.

31. The device of claim 25, wherein the lattice mismatch between the at least first and second material systems ranges from approximately 1 to 100%.

32. The device of claim 31, wherein the lattice mismatch between the at least first and second material systems ranges from approximately 1 to 5%.

33. The device of claim 25, wherein the at least first and second material systems of the superlattice film are periodically arranged.

34. A thermoelectric power conversion device according to claim 25 wherein the superlattice film has a thickness in the range of about 2.67 μm to approximately 5.4 μm.

35. A thermoelectric power conversion device according to claim 25 wherein the superlattice film has a thickness of at least approximately 2.67 μm.

36. A thermoelectric heating and cooling device comprising:
- a superlattice film of at least first and second material systems having different lattice constants and interposed in contact with each other;
- a physical interface at which said at least first and second material systems are joined with a lattice mismatch and at which structural integrity of said first and second material systems is maintained;
- said superlattice film of at least first and second material systems having a charge carrier transport direction normal to said physical interface and the superlattice film having a thickness of at least approximately 1.35 μm;
- at least one of a heat sink and a heat source connected to the superlattice film of at least first and second material systems;
- said thermoelectric device configured to direct charge transport to at least one of the heat sink for cooling and the heat source for heating; and
- a magnetizing mechanism including chemical dopants in thermoelectric nanostructures of the at least first and second material systems, said chemical dopants including magnetic materials.

37. The device of claim 36, wherein said heat sink comprises a cold side of 250 K to 310K and said heat source comprises a hot side of 310K to 450K.

38. The device of claim 36, wherein the thermoelectric device has a figure-of merit (ZT) of at least 1.4.

39. The device of claim 36, further comprising:
- a pressurizing mechanism including chemical dopants in thermoelectric nanostructures of the at least first and second material systems, said chemical dopants configured to generate a misfit-induced pressure in the structure.

40. The device of claim 36, wherein said heat sink is configured to connect to at least one of a microprocessor chip, a laser chip, and a superconducting chip.

41. The device of claim 36, wherein said heat source is configured to connect to components of at least one of a microprocessor chip, a laser chip, and a superconducting chip.

42. The device of claim 36, wherein the lattice mismatch between the at least first and second material systems ranges from approximately 1 to 100%.

43. The device of claim 42, wherein the lattice mismatch between the at least first and second material systems ranges from approximately 1 to 5%.

44. The device of claim 36, wherein the at least first and second material systems of the superlattice film are periodically arranged.

45. A thermoelectric heating and cooling device according to claim 36 wherein the superlattice film has a thickness in the range of about 2.67 μm to approximately 5.4 μm.

* * * * *

UNITED STATES PATENT AND TRADEMARK OFFICE
CERTIFICATE OF CORRECTION

PATENT NO. : 7,342,169 B2  Page 1 of 1
APPLICATION NO. : 10/265409
DATED : March 11, 2008
INVENTOR(S) : Venkatasubramanian et al.

It is certified that error appears in the above-identified patent and that said Letters Patent is hereby corrected as shown below:

Column 1, Line 23: Please insert:
--STATEMENT OF GOVERNMENT RIGHTS
The U.S. Government has a paid-up license in this invention and the right in limited circumstances to require the patent owner to license others on reasonable terms as provided for by the terms of Navy Contract No. N00014-97-C-0211 awarded by the Office of Naval Research.--

Column 20, Claim 25, Line 43: Please correct "Least"
To read --least--

Signed and Sealed this

Seventeenth Day of June, 2008

JON W. DUDAS
*Director of the United States Patent and Trademark Office*